United States Patent
Chen et al.

(10) Patent No.: US 12,062,719 B2
(45) Date of Patent: Aug. 13, 2024

(54) SEMICONDUCTOR DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW); National Taiwan Normal University, Taipei (TW)

(72) Inventors: Kuan-Ting Chen, Taichung (TW); Shu-Tong Chang, Taoyuan (TW); Min-Hung Lee, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW); NATIONAL TAIWAN NORMAL UNIVERSITY, Taipei (TW)

(*) Notice: Subject to any disclaimer, the term of this patent is extended or adjusted under 35 U.S.C. 154(b) by 0 days.

(21) Appl. No.: 17/874,005

(22) Filed: Jul. 26, 2022

(65) Prior Publication Data
US 2022/0359762 A1  Nov. 10, 2022

Related U.S. Application Data

(62) Division of application No. 17/110,536, filed on Dec. 3, 2020, now Pat. No. 11,942,546.

(51) Int. Cl.
*H01L 29/78* (2006.01)
*H01L 21/02* (2006.01)
*H01L 29/66* (2006.01)

(52) U.S. Cl.
CPC .. *H01L 29/78391* (2014.09); *H01L 21/02181* (2013.01); *H01L 21/02189* (2013.01);
(Continued)

(58) Field of Classification Search
CPC ......... H01L 29/78391; H01L 21/02181; H01L 21/02189; H01L 21/02205; H01L 21/0228;
(Continued)

(56) References Cited

U.S. PATENT DOCUMENTS 9,991,352 B1   6/2018 Frougier et al.
10,088,320 B1  10/2018 Ramlall
(Continued)

FOREIGN PATENT DOCUMENTS

CN   102625447 A   8/2012
CN   109143167 A   1/2019
(Continued)

OTHER PUBLICATIONS

Dogan et al, "Causes of ferroelectricity in HfO2-based thin films: An ab initio perspective," arXiv:1904.01213v1 [cond-mat.mtrl-sci] Apr. 2, 2019. (Year: 2019).*
(Continued)

*Primary Examiner* — Julia Slutsker
(74) *Attorney, Agent, or Firm* — Birch, Stewart, Kolasch & Birch, LLP

(57) ABSTRACT

A semiconductor device includes a substrate, a gate structure over the substrate, and source/drain regions in the substrate and on opposite sides of the gate structure. The gate structure includes an interfacial layer, a quasi-antiferroelectric (QAFE) layer over the interfacial layer, and a gate electrode over the QAFE layer. The QAFE layer includes $Hf_{1-x}Zr_xO_2$, in which x is greater than 0.5 and is lower than 1.

20 Claims, 36 Drawing Sheets

(52) U.S. Cl.
CPC .... *H01L 21/02205* (2013.01); *H01L 21/0228* (2013.01); *H01L 29/6684* (2013.01)

(58) Field of Classification Search
CPC ........... H01L 29/6684; H01L 21/02194; H01L 21/28194; H01L 29/42392; H01L 29/513; H01L 29/516; H01L 29/66545; H01L 29/66795; H01L 29/78696; H01L 29/78; H01L 29/511
See application file for complete search history.

(56) References Cited

U.S. PATENT DOCUMENTS

| | | | |
|---|---|---|---|
| 10,978,470 | B2 | 4/2021 | Zhu |
| 2009/0286551 | A1 | 11/2009 | Kennedy et al. |
| 2013/0316546 | A1 | 11/2013 | Tong |
| 2017/0309625 | A1 | 10/2017 | Kim et al. |
| 2018/0063807 | A1 | 3/2018 | Tipton et al. |
| 2019/0067488 | A1 | 2/2019 | Tsai et al. |

FOREIGN PATENT DOCUMENTS

| | | |
|---|---|---|
| RU | 2681278 C1 | 4/2018 |
| WO | WO 2011108958 A1 | 9/2011 |
| WO | WO 2018138904 A1 | 8/2018 |

OTHER PUBLICATIONS

Chen et al., "Ferroelectric HfZrOx FETs on SOI Substrate With Reverse-DIBL (Drain-Induced Barrier Lowering) and NDR (Negative Differential Resistance)", Journal of the Electron Devices Society, 2018, vol. 6, , pp. 900-904.

Khan et al., "Ferroelectric Negative Capacitance MOSFET: Capacitance Tuning & Antiferroelectric Operation", 2011 International Electron Devices Meeting, 2011.

Lee et al. "Physical Thickness 1.x nm Ferroelectric HfZrOx Negative Capacitance FETs," 2016 IEEE Intl Electron Devices Meeting (IEDM), Dec. 3-7, 2016 (Year: 2016), pp. 16-306-16-309.

Lee et al., "Ferroelectricity of HfZrO2 in Energy Landscape With Surface Potential Gain for Low-Power Steep-Slope Transistors." Journal of Electron Devices Society, vol. 3, No. 4, pp. 377-381, 2015 (Year:2015).

Lee et al., "Prospects for Ferroelectric HfZrOx FETs with Experimentally CET=0.98nm, SSfor=42mV/dec, SSrev=28mV/dec, Switch-OFF <0.2V, and Hysteresis-Free Strategies", 2015 IEEE International Electron Devices Meeting (IEDM), 2015.

Lee et al., "Bi-directional Sub-60mV/dec, Hysteresis-Free, Reducing Onset Voltage and High Speed Response of Ferroelectric-AntiFerroelectric Hf0.25Zr0.75O2 Negative Capacitance FETs", 2019 IEEE International Electron Devices Meeting (IEDM), 2019.

Lee et al., "Experimental Demonstration of Negative Capacitance epi-Ge/Si FETs with Ferroe-lectric Hf-based Oxide Gate Stack for Swing Sub-60mV/dec and Hysteresis-Free", Extended Abstracts of the 2016 International Conference on Solid State Devices and Materials, Tsukuba, 2016, pp. 15-16.

Migita et al., "Assessment of Steep-Subthreshold Swing Behaviors in Ferroelectric-Gate Field-Effect Transistors Caused by Positive Feedback of Polarization Reversal", 2018 IEEE International Electron Devices Meeting (IEDM), 2018.

Rusu et al., "Metal-Ferroelectric-Metal-Oxide-Semiconductor Field Effect Transistor with Sub-60mV/decade Subthreshold Swing and Internal Voltage Amplification", 2010 International Electron Devices Meeting. 2010.

Salahuddin et al., "Can the subthreshold swing in a classical FET be lowered below 60 mV/decade?", 2008 IEEE International Electron Devices Meeting, 2008.

Salahuddin et al., "Use of Negative Capacitance to Provide Voltage Amplification for Low Power Nanoscale Devices", Nano Letters, 2008, vol. 8, No. 2, pp. 405-410.

Shi et al., "Development of ALD HfZrOx with TDEAH/TDEAZ and H2O," J. Electrochem. Soc. 158 H69, 2011 (Year: 2011), pp. H68-H74.

Lee et al., "Steep Slope and Near Non-Hysteresis of FETs With Antiferroelectric-Like HfZrO for Low-Power Electronics", IEEE Electron Device Letters, vol. 36, No. 4, Apr. 2015, pp. 294-296.

Shibayama et al., "Thermodynamic control of ferroelectric-phase formation in HfxZr1—xO2 and ZrO2", Journal of Applied Physics, vol. 124, 2018, pp. 184101-1-184101-7 (8 pages total).

Jin et al., "Experimental Study on the Role of Polarization Switching in Subthreshold Characteristics of HfO2-based Ferroelectric and Anti-ferroelectric FET," IEEE 2018, 2018, 4 pages total.

Triyoso et al., "Material Innovation in the Era of Artificial Intelligence—A Case Study of Hf—Zr Systems," IEEE Electron Devices Technology and Manufacturing Conference Proceedings of Technical Papers, Apr. 2020, 4 pages total.

* cited by examiner

SEMICONDUCTOR DEVICE AND METHOD FOR FORMING THE SAME

CROSS-REFERENCE TO RELATED APPLICATION

The present application is a Divisional application of U.S. patent application Ser. No. 17/110,536, filed on Dec. 3, 2020, which is hereby incorporated herein by reference.

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately logarithmic linear behavior in this metal-oxide-semiconductor field-effect transistor (MOSFET) operating region. To improve the subthreshold properties, a negative capacitance field effect transistor (NC-FET) has been proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
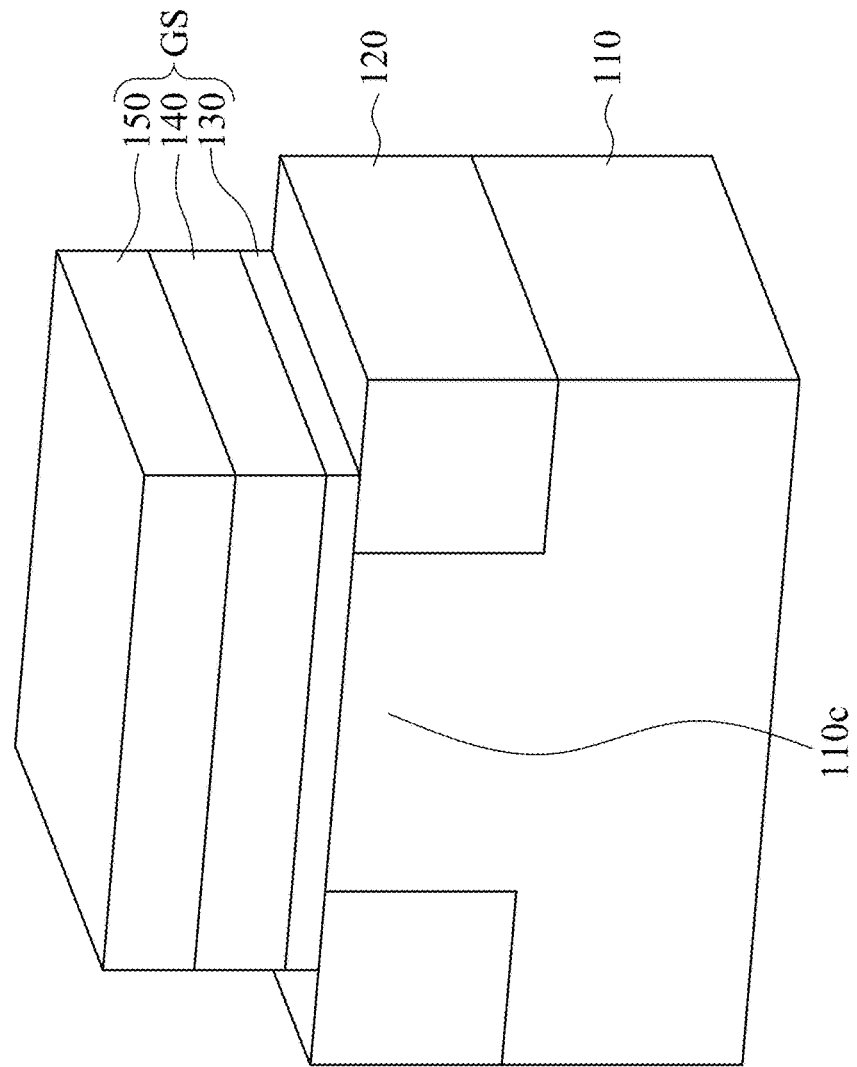
FIG. 1 illustrates a perspective view of an example NC-FET in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Integrated Circuit (IC) devices have been evolving rapidly over the last several decades. A typical IC chip may include numerous active devices such as transistors and passive devices such as resistors, inductors, and capacitors. As the transistor size is scaled down, continuously scaling down of voltage (e.g., power supply) is a target for ultra-low power devices. However, voltage scaling down will meet the bottleneck of physical limitation of subthreshold swing (SS) with 60 mV/decade, which is accompanied with a higher off-state leakage current. An NC-FET, which introduces negative capacitance to a gate stack of MOSFET, will overcome the problem. The negative-capacitance may result from the ferroelectricity of a dielectric layer (also called ferroelectric layer) in the gate stack.

Ferroelectric (FE) Hf-based oxide gate integrated with transistors as FeFET (Ferroelectric FETs) has promising solution for low power consumption with two naturally major characteristics of hysteresis and steep-SS for negative capacitance (NC) concept, due to CMOS compatible process and scaling down ability. Pursuing steep SS with accompanying hysteresis is a challenge for NC-FET development, as well as the issue of asymmetric SS of bi-directional sweep. Moreover, the reduced NC onset voltage is another challenge to boost steep SS at low operation bias.

Aspects of the present disclosure provide an NC-FET having a quasi-antiferroelectric (interchangeably referred to as QAFE) material, wherein the QAFE material allows the NC-FET operates at steep subthreshold swing (e.g., lower than 60 mV/decade) but has no hysteresis or negligible hysteresis. Although the NC-FET described herein is manufactured in a front end of line (FEOL), it is noted that the NC-FET described can also be manufactured in a back end of line (BEOL).

FIG. 1 illustrates a perspective view of an example NC-FET 100 in accordance with some embodiments of the present disclosure. The NC-FET 100 includes a substrate 110, source/drain regions 120 formed in the substrate 110, an interfacial layer 130 over the substrate 110, a QAFE layer 140 over the interfacial layer 130 and a gate electrode 150 over the QAFE layer 140. The interfacial layer 130, the QAFE layer 140 and the gate electrode 150 can be in combination referred to as a gate structure GS.

In some embodiments, the substrate 110 may include group IV semiconductor material, e.g., Si, Ge, SiGe, or SiC, or other suitable materials. In certain embodiments, the substrate 110 includes doped Si, such as Si doped with p-type dopant (e.g., boron) or n-type dopant (e.g., phosphorus) Alternatively, the substrate 110 may include a III-V material, e.g., GaAs, GaP, GaAsP, AlInAs, AlGaAs, GaInAs, InAs, GaInP, InP, InSb, and/or GaInAsP; or a combination thereof. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In some embodiments, the substrate 110 may include one or more transition metal dichalcogenide (TMD) material layers. A TMD material may include a compound of a transition metal and a group VIA element. The transition metal may include tungsten (W), molybdenum (Mo), Ti, or the like, while the group VIA element may comprise sulfur (S), selenium (Se), tellurium (Te), or the like. For example, the substrate 110 may include $MoS_2$, $MoSe_2$, $WS_2$, $WSe_2$, combinations thereof; or the like.

The source/drain regions 120 are doped regions in the substrate 110 and located on opposite sides of the gate structure GS. In some embodiments, the source/drain regions 120 include p-type dopants such as boron for formation of p-type FETs. In some other embodiments, the source/drain regions 120 include n-type dopants such as phosphorus for formation of n-type FETs. In some embodiments, the source/drain regions 120 may be epitaxial structures doped with p-type dopants or n-type dopants. The source/drain regions 120 are spaced apart by a channel region 110c in the semiconductor substrate 110.

The interfacial layer 130 may include a dielectric material such as silicon oxide ($SiO_2$), $Al_2O_3$, $HfO_2$, $ZrO_2$. In some embodiments, the interfacial layer 130 may include high-k dielectric material. In some embodiments, the thickness of the interfacial layer 130 is in a range from about 0.1 nm to about 10 nm. In the depicted embodiments, the interfacial layer 130 extends along a top surface of the channel region 110e and past opposite edges of the channel region 110c to reach the source/drain regions 120. In some embodiments, portions of the source/drain regions 120 are vertically below the QAFE layer 140.

The QAFE layer 140 is between the interfacial layer 130 and the gate electrode 150 to provide a negative capacitance effect. In some embodiments, the QAFE layer 140 may include high-k dielectric material, such as $HfZrO_2$ (HZO), HAO (Al-Doped $HfO_2$), HSO (Si-Doped $HfO_2$), lead-zirconate-titanate (PZT), strontium bismuth tantalite (SBT). In some embodiments, the thickness of the QAFE layer 140 is in a range from about 1 nm to about 15 nm. In certain embodiments, the QAFE layer 140 is about 10 nm.

In some embodiments, the QAFE layer 140 is formed of quasi-antiferroelectric $Hf_{1-x}Zr_xO_2$ (also called QAFE-HZO in this context, wherein $0.5<x<1$). In some embodiments, the zirconium atomic percentage of the QAFE layer 140 is greater than about 50% and is lower than about 99%. In certain embodiments, the QAFE layer 140 is $Hf_{0.25}Zr_{0.75}O_2$ (i.e., zirconium atomic percentage is 75% relative to hafnium atomic percentage). The QAFE-HZO material exhibits a mixture of ferroelectricity (FE) and antiferroelectricity (AFE) with small but not zero remnant polarization ($P_r$) and coercive voltage ($V_c$) while applied low bias. This benefits reduced NC onset voltage and non-hysteretic possibility as well as the low charge balance for steep SS. In some embodiments, the remnant polarization ($P_r$) of the QAFE layer 140 is in a range from about 0.5 $\mu C/cm^2$ to about 5 $\mu C/cm^2$ when a sweep voltage 3 V is applied, and the coercive voltage ($V_c$) of the QAFE layer 140 is in a range from about 0.1 V to about 0.5 V when a sweep voltage 3 V is applied.

The crystalline structure of the QAFE layer 140 is a mixture of tetragonal phase and orthorhombic phase. In some embodiments, the ratio of the tetragonal phase to the orthorhombic in the QAFE layer 140 is in a range from about 1/10 to about 10:1. In some embodiments, if the ratio is too small (e.g., much lower than 1/10), this indicates that orthorhombic phase is dominant over the tetragonal phase, and the property would be close to ferroelectricity. On the other hand, if the ratio is too large (e.g., higher than 10), this indicates that tetragonal phase is dominant over the orthorhombic phase, and the property would be close to antiferroelectricity.

The gate electrode 150 may be conductive material, such as metal. In some embodiments, the gate electrode 150 includes TaN, TiN, W, Pt, Mo, Ta, Ti, Silicide, or the like. In some embodiments, the gate electrode 150 may include one or more metals or their alloy. In some embodiments, the thickness of the gate electrode 150 is in a range from about 1 nm to about 1000 nm. In certain embodiments, the gate electrode 150 is about 120 nm.

As illustrated, the polarization transition is shown from FE to QAFE with increasing doped Zr. For example, the loop at zero voltage (e.g., 0 V) is narrowing, and remnant polarization ($P_r$) and coercive voltage ($V_c$) are closer to zero for Zr=75% sample. Here, the term "remnant polarization ($P_r$)" may be defined as the magnitude of polarization at V=0. On the other hand, the term "coercive voltage ($V_c$)" may be defined as the magnitude of voltage at polarization=0. Note that Zr=75% is a mixture of FE and AFE due to $P_r$ & $V_c$ are small (but not equal to zero). For example, the exact antiferroelectric (AFE) ought to be pure $ZrO_2$. For comparison, Zr=50% can be regarded as FE-HZO.

Figure 2:
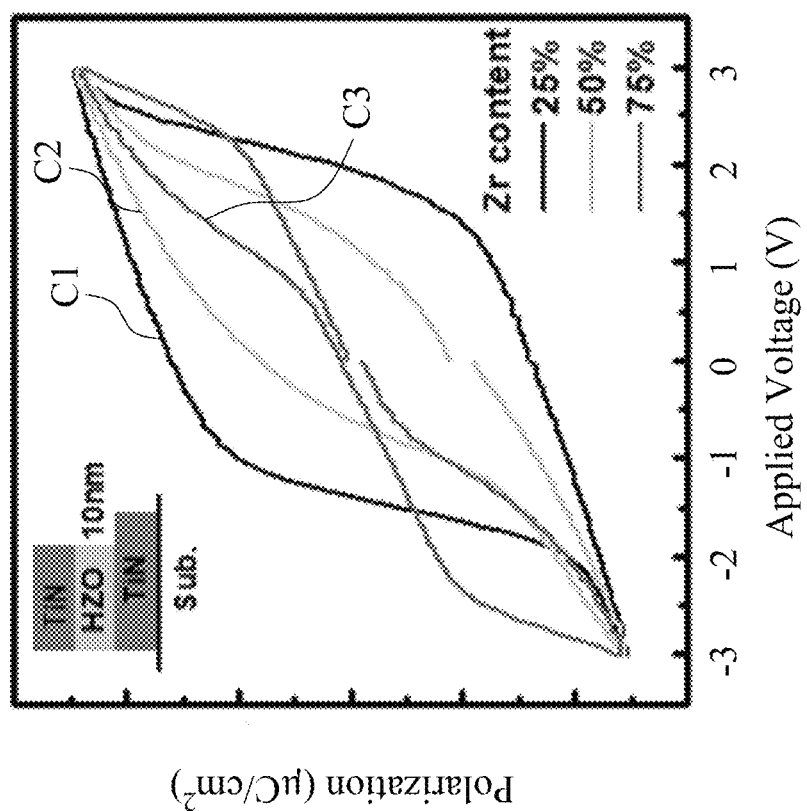
FIG. 2 shows polarization-voltage (P-V) loop of HZO ($Hf_{1-x}Zr_xO_2$) with Zr=25%, 50% and 75% in accordance with some embodiments of the present disclosure.

FIG. 2 shows polarization-voltage (P-V) loop of HZO ($Hf_{1-x}Zr_xO_2$) with Zr=25%, 50% and 75% in some embodiments of the present disclosure. In FIG. 2, the loop C1 represents a P-V loop of $Hf_{0.75}Zr_{0.25}O_2$ (i.e., zirconium atomic percentage is 25%), the loop C2 represents a P-V loop of $Hf_{0.5}Zr_{0.5}O_2$ (i.e., zirconium atomic percentage is 50%), and the loop C3 represents a P-V curve of $Hf_{0.25}Zr_{0.75}O_2$ (i.e., zirconium atomic percentage is 75%). The P-V loop C1 is obtained from a capacitor stack formed of a lower titanium nitride layer, a $Hf_{0.75}Zr_{0.25}O_2$ layer over the lower titanium nitride layer, and an upper titanium nitride layer over the $Hf_{0.75}Zr_{0.25}O_2$ layer, wherein the $Hf_{0.75}Zr_{0.25}O_2$ layer has a thickness in a range from about 8 nm to about 12 nm (e.g., about 10 nm). The P-V loop C2 is obtained from a capacitor stack formed of a lower titanium nitride layer, a $Hf_{0.5}Zr_{0.5}O_2$ layer over the lower titanium nitride layer, and an upper titanium nitride layer over the $Hf_{0.5}Zr_{0.5}O_2$ layer, wherein the $Hf_{0.5}Zr_{0.5}O_2$ layer has a thickness in a range from about 8 nm to about 12 nm (e.g., about 10 nm). The P-V loop C3 is obtained from a capacitor stack formed of a lower titanium nitride layer, a $Hf_{0.25}Zr_{0.75}O_2$ layer over the lower titanium nitride layer, and an upper titanium nitride layer over the $Hf_{0.25}Zr_{0.75}O_2$ layer, in which the $Hf_{0.75}Zr_{0.25}O_2$ layer has a thickness in a range from about 8 nm to about 12 nm (e.g., about 10 nm).

Comparing the P-V loop C3 with the P-V loops C1 and C2, it is observed that the polarization transition is shown from FE to QAFE with increasing zirconium atomic concentration increasing from 25% to 75%. The P-V loop C3 at zero voltage is narrowing, and the remnant polarization ($P_r$) and coercive voltage ($V_c$) are closer to zero for Zr=75%. Here, the term "remnant polarization ($P_r$)" may be defined as the magnitude of polarization at V=0. On the other hand, the term "coercive voltage ($V_c$)" may be defined as the magnitude of voltage at polarization=0. It is noted that $Hf_{0.25}Zr_{0.75}O_2$ composition exhibits a mixture of ferroelectricity and antiferroelectricity due to the remnant polarization ($P_r$) and coercive voltage ($V_c$) are small (but not equal to zero) and this unique property different from exact ferroelectricity and exact antiferroelectricity is denoted as quasi-antiferroelectricity in this context. For example, the exact antiferroelectric (AFE) ought to be pure $ZrO_2$. For comparison, Zr=50% can be regarded as FE-HZO.

Figure 3:
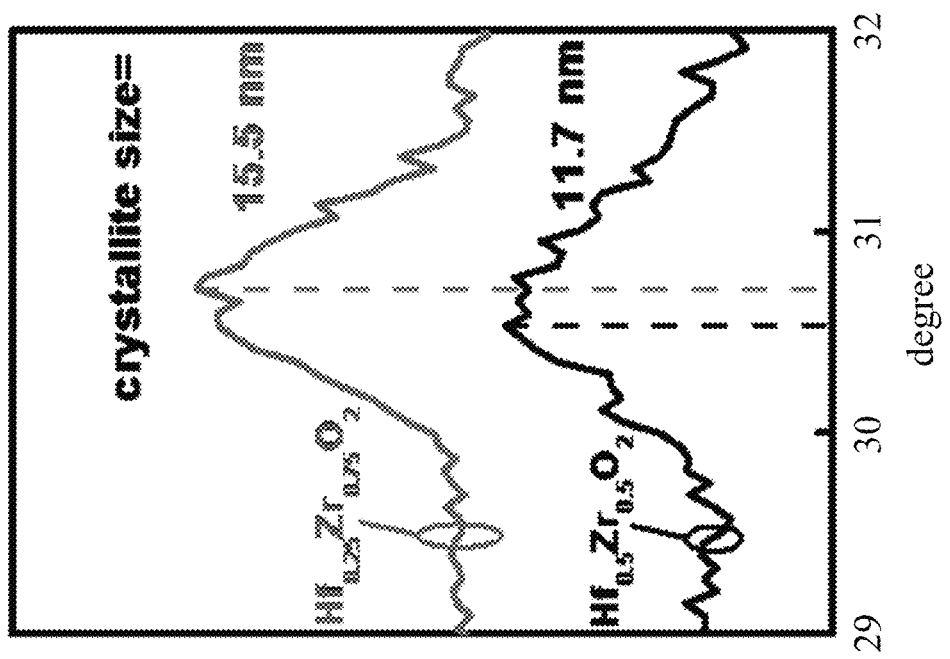
FIG. 3 illustrates a GI-XRD (Grazing incidence X-ray diffraction) of FE ($Hf_{0.5}Zr_{0.5}O_2$) and QAFE ($Hf_{0.25}Zr_{0.75}O_2$) in accordance with some embodiments of the present disclosure.

FIG. 3 illustrates a GI-XRD (Grazing incidence X-ray diffraction) of FE ($Hf_{0.5}Zr_{0.5}O_2$) and QAFE ($Hf_{0.25}Zr_{0.75}O_2$). The FE and AFE characteristics of the HZO film after annealing is believed to be a result of orthorhombic and tetragonal phase, respectively. The peak position of $Hf_{0.5}Zr_{0.5}O_2$ and $Hf_{0.25}Zr_{0.75}O_2$ are about 30.5° and about 30.7°, respectively, and this indicates more tetragonal phase as the Zr concentration increases. The crystalline sizes are about 11.7 nm and 15.5 nm by Scherrer equation.

Figure 4:
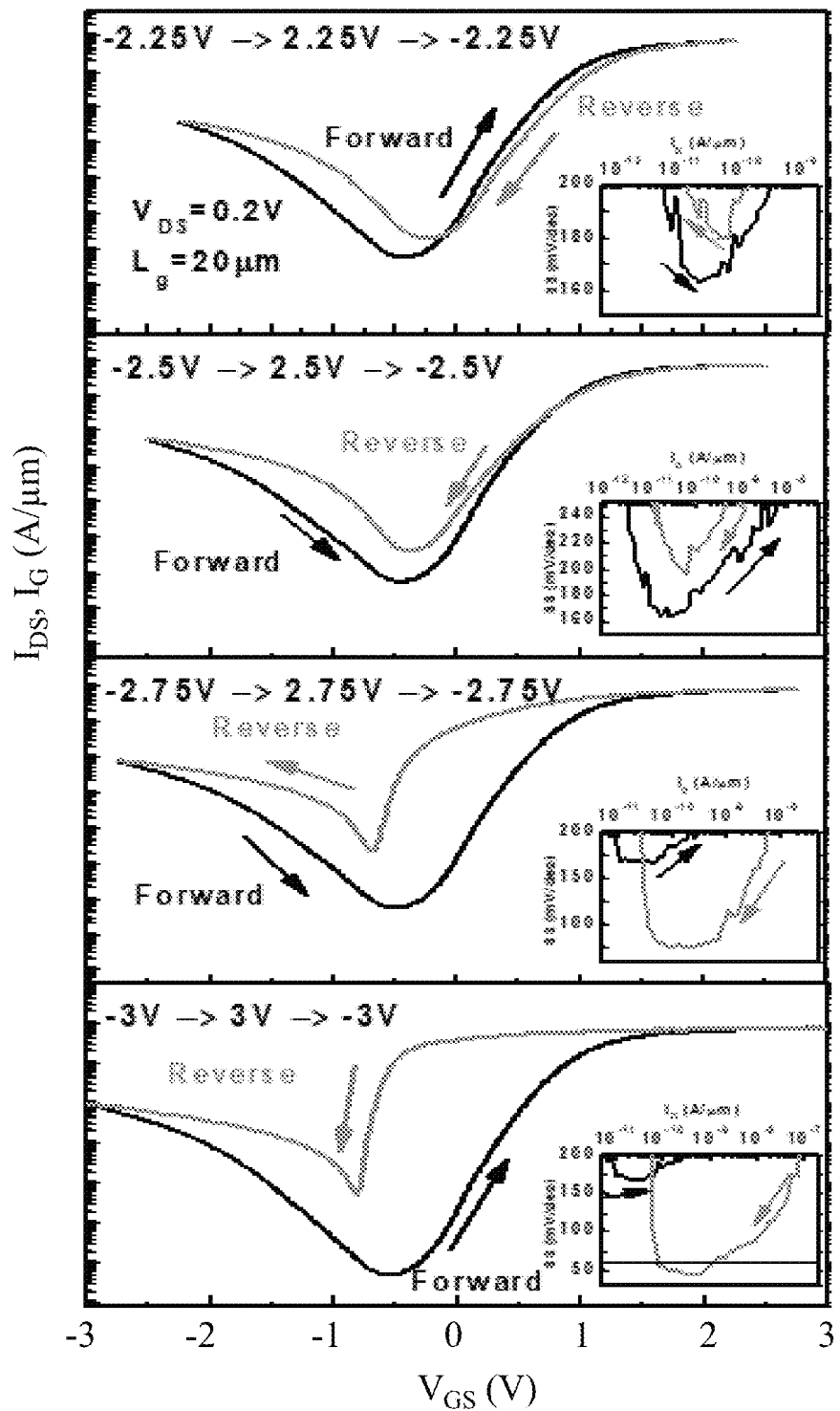
FIG. 4 illustrates transfer characteristics of a QAFE-HZO FET in accordance with some embodiments of the present disclosure.
Figure 5:
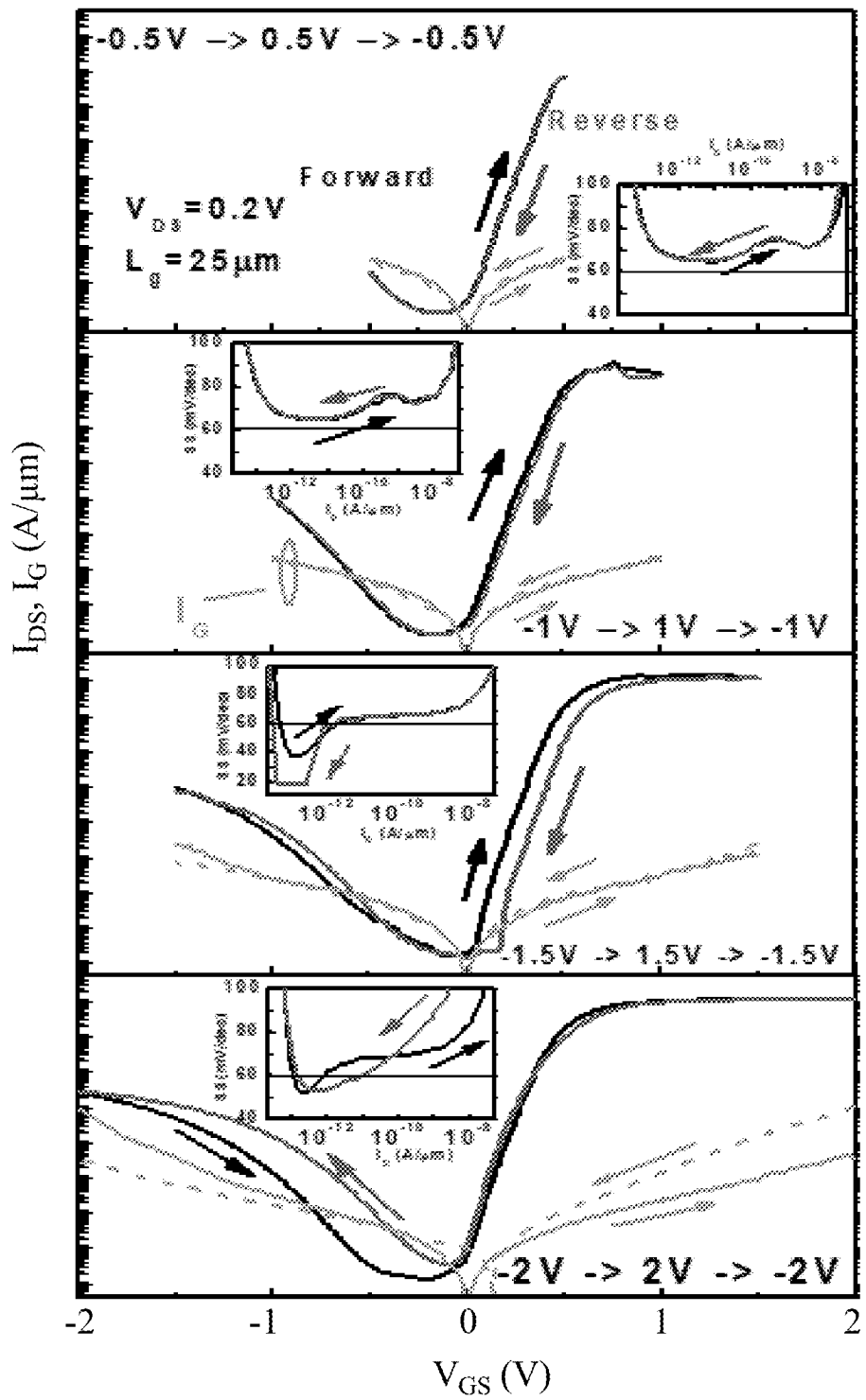
FIG. 5 illustrates transfer characteristics of a QAFE-HZO FET in accordance with some embodiments of the present disclosure.
Figure 6:
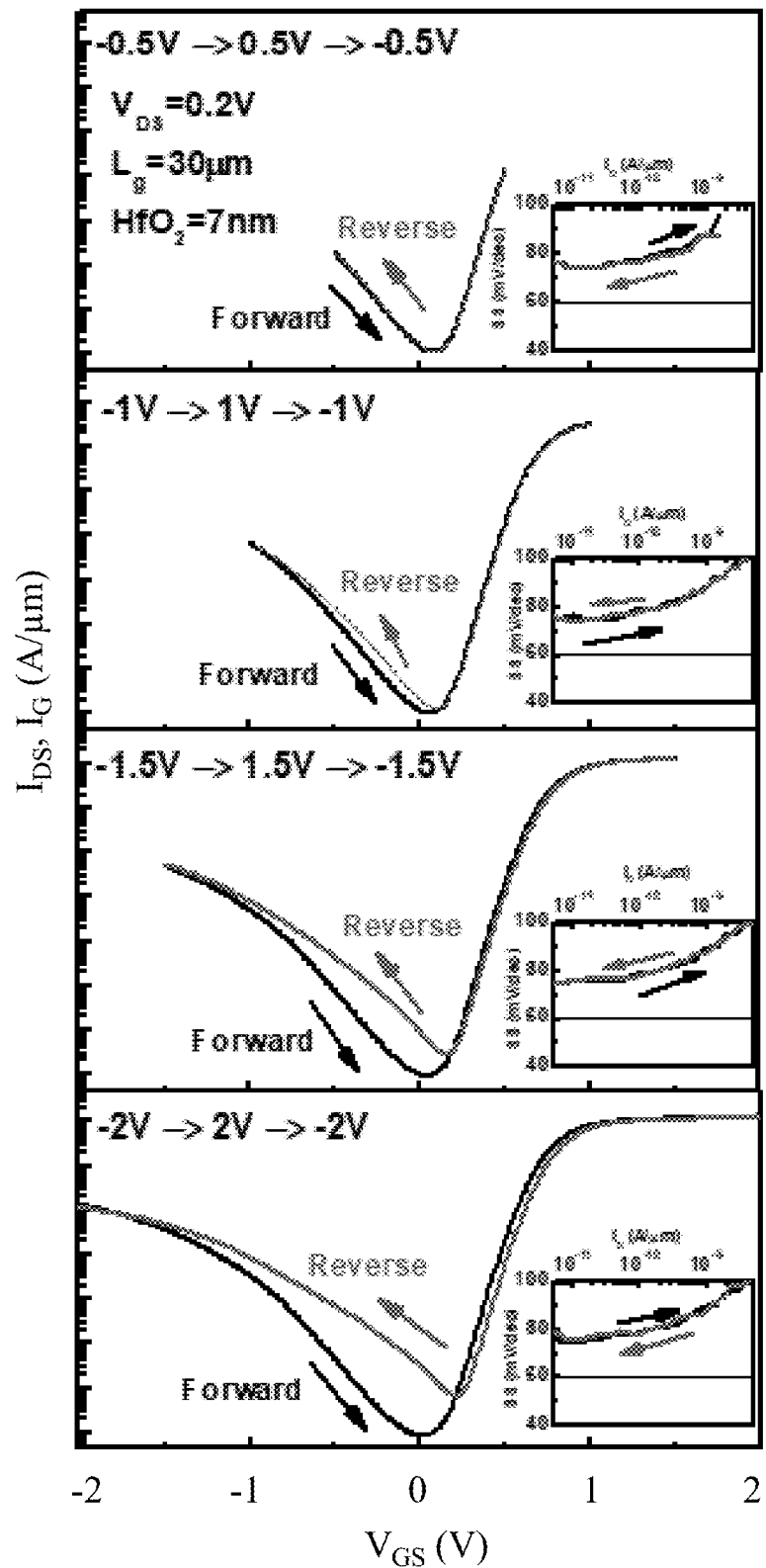
FIG. 6 illustrates transfer characteristics of a QAFE-HZO FET in accordance with some embodiments of the present disclosure.

FIG. 4 illustrates transfer characteristics (e.g., forward and reverse $I_{DS}$-$V_{GS}$ curves) of a FE-HZO FET (i.e., a transistor including a $Hf_{0.5}Zr_{0.5}O_2$ layer formed between gate and channel region) with $V_{DS}$ in a range from about 0.1 V to about 0.3 V (e.g., about 0.2 V) and double sweep $V_{GS}$ increasing range, in accordance with some embodiments of the present disclosure. FIG. 5 illustrates transfer characteristics (e.g., forward and reverse $I_{DS}$-$V_{GS}$ curves) of a QAFE-HZO FET (i.e., a transistor including a $Hf_{0.25}Zr_{0.75}O_2$ layer formed between gate and channel region) with $V_{DS}$ in a range from about 0.1 V to about 0.3 V (e.g., about 0.2 V) and double sweep $V_{GS}$ increasing range, in accordance with some embodiments of the present disclosure. FIG. 6 illustrates transfer characteristics (e.g., forward and reverse $I_{DS}$-$V_{GS}$ curves) of a non-ferroelectric FET (i.e., a transistor including a $HfO_2$ layer formed between gate and channel region) with $V_{DS}$ in a range from about 0.1 V to about 0.3 V (e.g., about 0.2 V) and double sweep $V_{GS}$ increasing range, in accordance with some embodiments of the present disclosure.

As illustrated in FIG. 4, the transfer characteristics of FE-HZO FET presents wide hysteresis and steep SS in reverse (backward) curve with sweep $V_{GS}$ range to about |2.75V|, and SS lower than 60 mV/decade would be obtained in the reverse curve with sweep $V_{GS}$ range to about |3V|. On the other hand, as illustrated in FIG. 5, the transfer characteristics of QAFE-HZO FET presents the SS lower than 60 mV/decade in both forward and reverse curves with sweep $V_{GS}$ range to about |1.5V|, and no or negligible hysteresis ($\Delta V_t$<1 mV, where $\Delta V_t$ is defined as $V_{t,\ forward}$-$V_{t,\ reverse}$) of double sweep with the sweep $V_{GS}$ range to about 2V. Moreover, FIG. 5 further shows that the gate leakage current is significant lower than the drain current $I_{DS}$. On the other hand, FIG. 6 shows that the transfer characteristics of non-ferroelectric FET present SS higher than 60 mV/decade. Based on FIGS. 4-6, it is observed that as compared to FE-HZO FET and non-ferroelectric FET, QAFE-HZO FET advantageously presents bi-directional sub-60 mV/decade (e.g., $SS_{forward}$ in a range from about 50 mV/decade to about 52 mV/decade, such as about 51 mV/decade, and $SS_{reverse}$ in a range from about 52 mV/decade to about 54 mV/decade, such as about 53 mV/decade), no or negligible hysteresis ($\Delta V_t$<1 mV), and reduced onset voltage.

Figure 7:
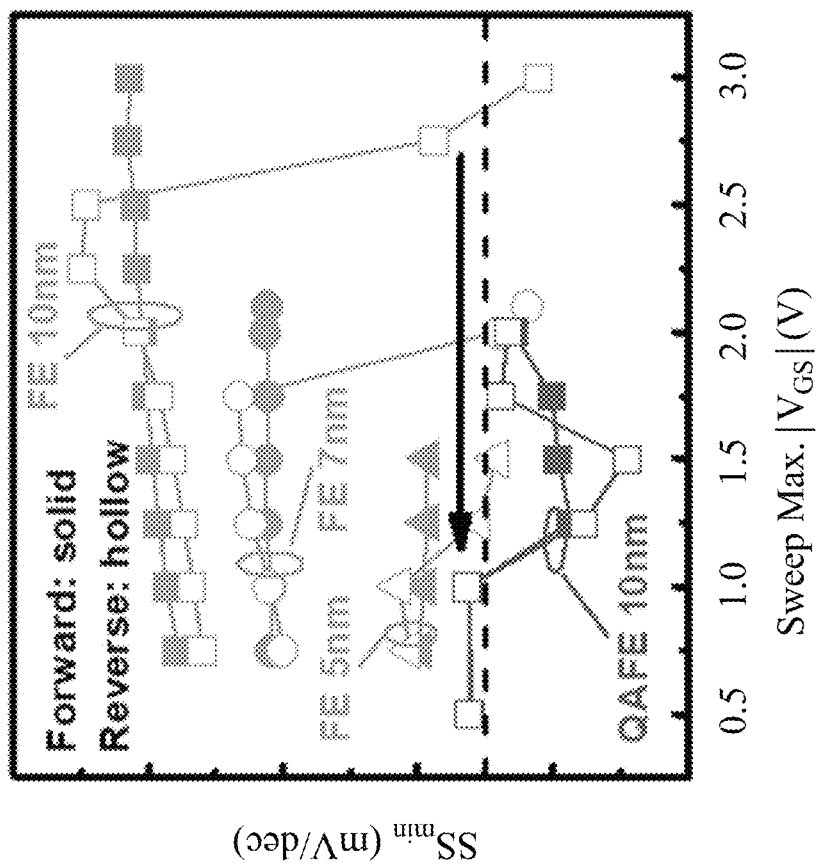
FIGS. 7 and 8 illustrate summarized $SS_{min}$ (mV/dec) and $\Delta V_T$ of FE-HZO and QAFE-HZO, respectively, in accordance with some embodiments of the present disclosure.
Figure 8:
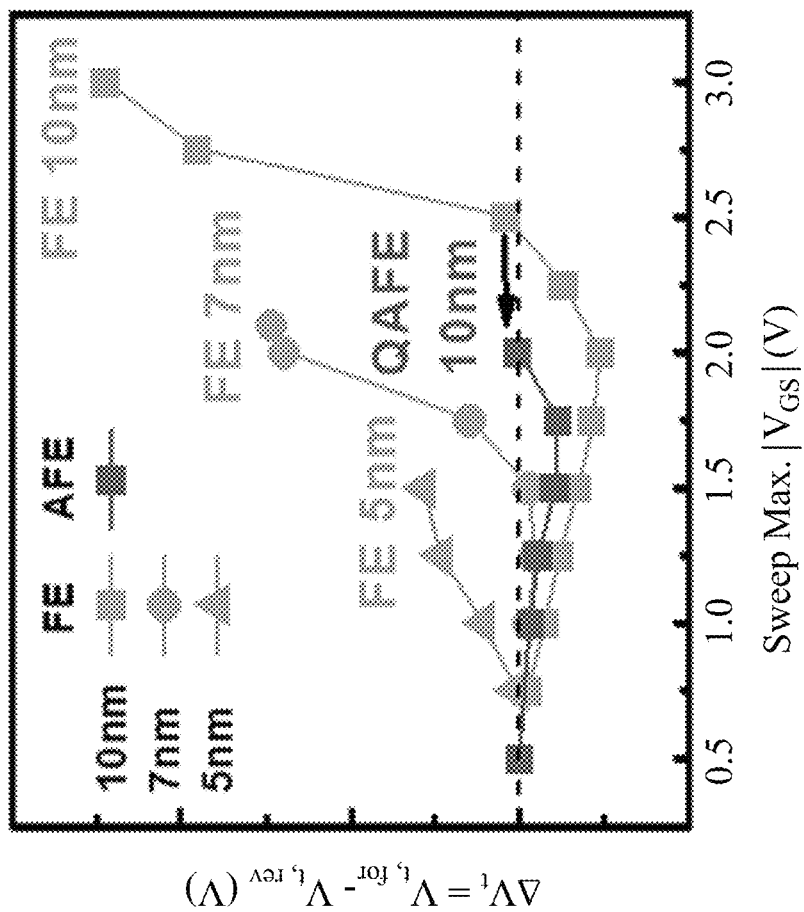

FIGS. 7 and 8 illustrate summarized $SS_{min}$(mV/dec) and $\Delta V_T$ of FE-HZO and QAFE-HZO, respectively. For FE-HZO, the NC onset voltage (e.g., voltage where SSmin is lower than about 60 mV/decade) is larger than hysteresis onset (e.g., voltage where $\Delta V_T$ is about 0). This indicates the improvement on SS accompanied with a non-negligible hysteresis for FE-HZO. However, the NC onset voltage is smaller than hysteresis onset for QAFE-HZO, i.e. there is an operation window for steep SS without hysteresis.

Figure 9:
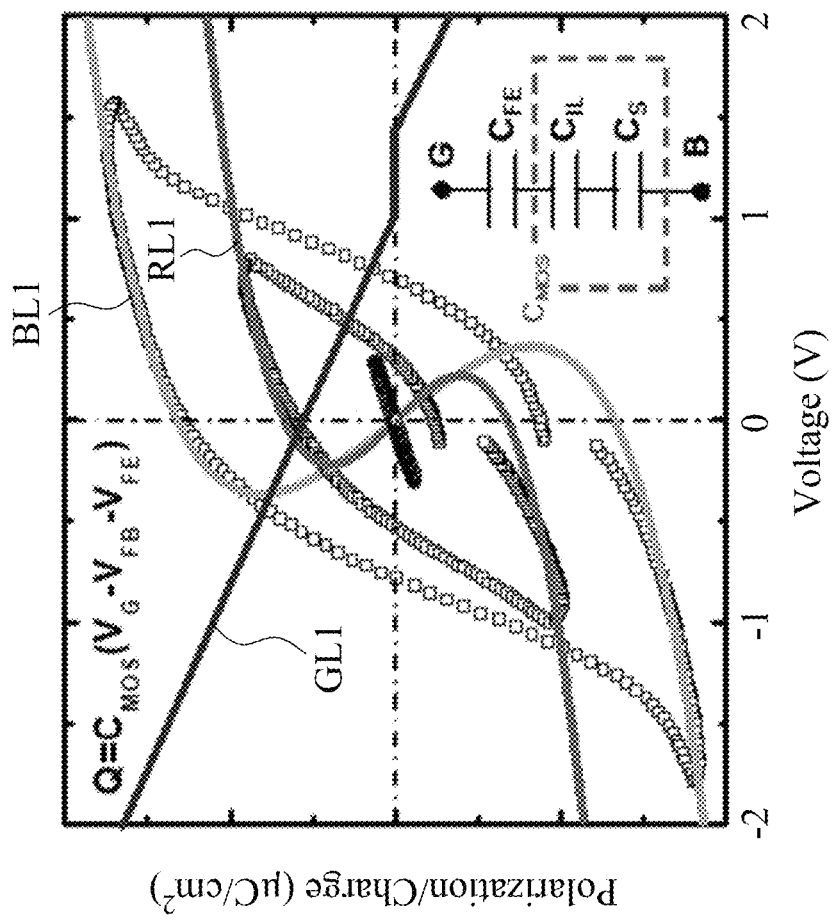
FIG. 9 illustrates measured P-V and calculated S-shape by L-K model with MOS load line for FE-HZO in accordance with some embodiments of the present disclosure.
Figure 10:
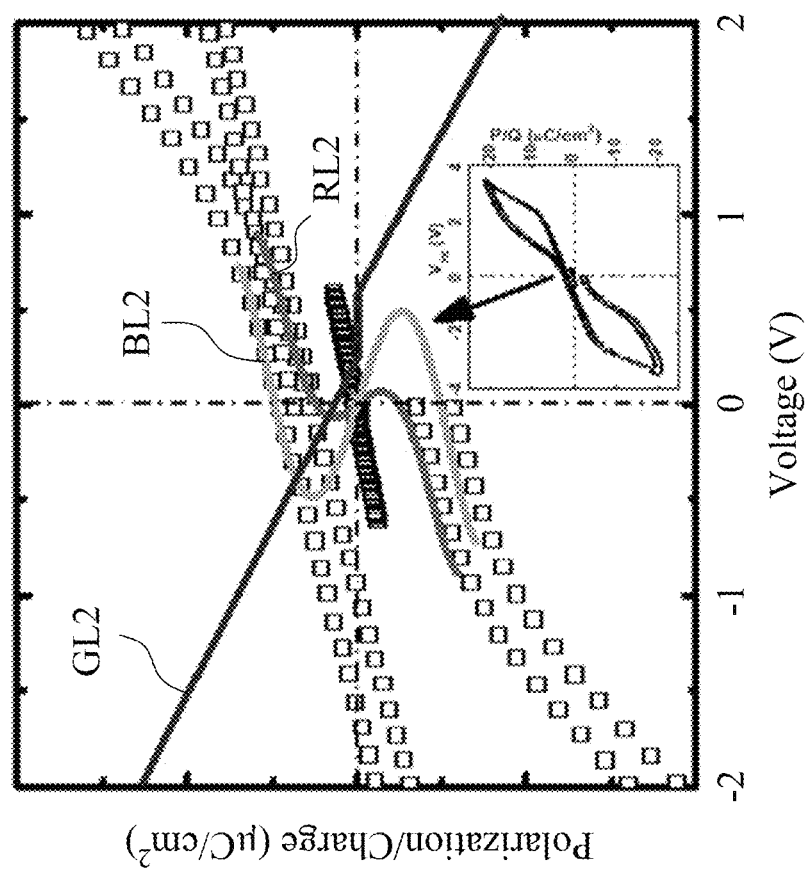
FIG. 10 illustrates measured P-V and calculated S-shape by L-K model with MOS load line for QAFE-HZO in accordance with some embodiments of the present disclosure.

FIG. 9 illustrates measured P-V and calculated S-shape by L-K model with MOS load line for FE-HZO. FIG. 10 illustrates measured P-V and calculated S-shape by L-K model with MOS load line for QAFE-HZO. The FET load line and M/FE/M & M/QAFE/M polarization are presented, and the charge balance is the solution. Here, the term "M/FE/M" indicates a metal-FE layer-metal stack capacitor, and the term "M/FE/M" indicates a metal-QAFE layer-metal stack capacitor. In FIG. 9, as the voltage drop on FE-HZO increases to open the polarization loop, and the S-shape RL1 is added and intersects with FET load line GL1 at positive capacitance (PC) region (dP/dV>0), with the hysteresis loop spreading with $V_{FE}$ increasing, the charge balance would be occurred at dP/dV<0 region as for NC effect (intersection of BL1 and GL1). Therefore, the bias for FE-FET hysteresis (ferroelectric characteristics) is smaller than steep SS (NC effect). That is, the improvement on SS with non-negligible hysteresis is occurred for FE-HZO. On the other hand, in FIG. 10, the S-shape (RL2) for small $V_{FE}$ is crossover with load line (GL2) at NC region (dP/dV<0) for QAFE-HZO, and then, the PC region is occurred with $V_{FE}$ increasing (intersection of BL2 and GL2). In FIG. 10, the $P_r$ of QAFE is restricted with increasing applied voltage and S-shape would be spreaded in voltage/E-field direction (i.e., lateral direction in FIG. 10). This leads to a window of charge balance solution for steep SS without hysteresis.

FIGS. 11 to 19 illustrate a method in various stages of fabricating a NC-FET in accordance with some embodiments of the present disclosure.

Figure 11:
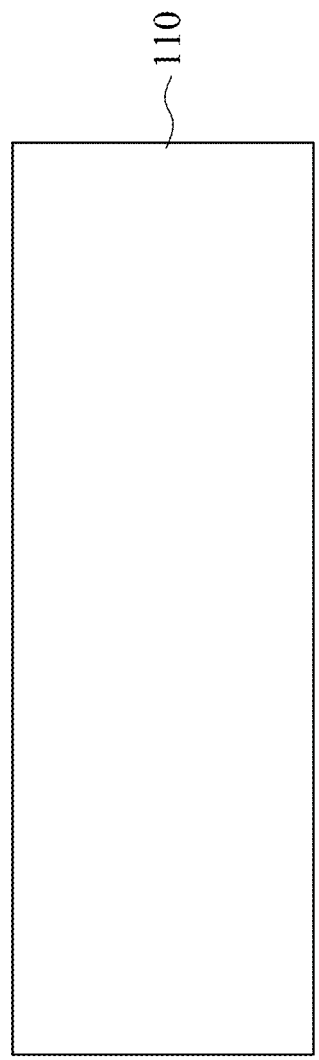
FIGS. 11 to 19 illustrate a method in various stages of fabricating a NC-FET in accordance with some embodiments of the present disclosure.

Reference is made to FIG. 11. A substrate 110 is shown. In some embodiments, the substrate 110 may include silicon (Si). In certain embodiments, the substrate 110 includes doped Si, such as Si doped with p-type dopant (e.g., boron). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

Figure 12:
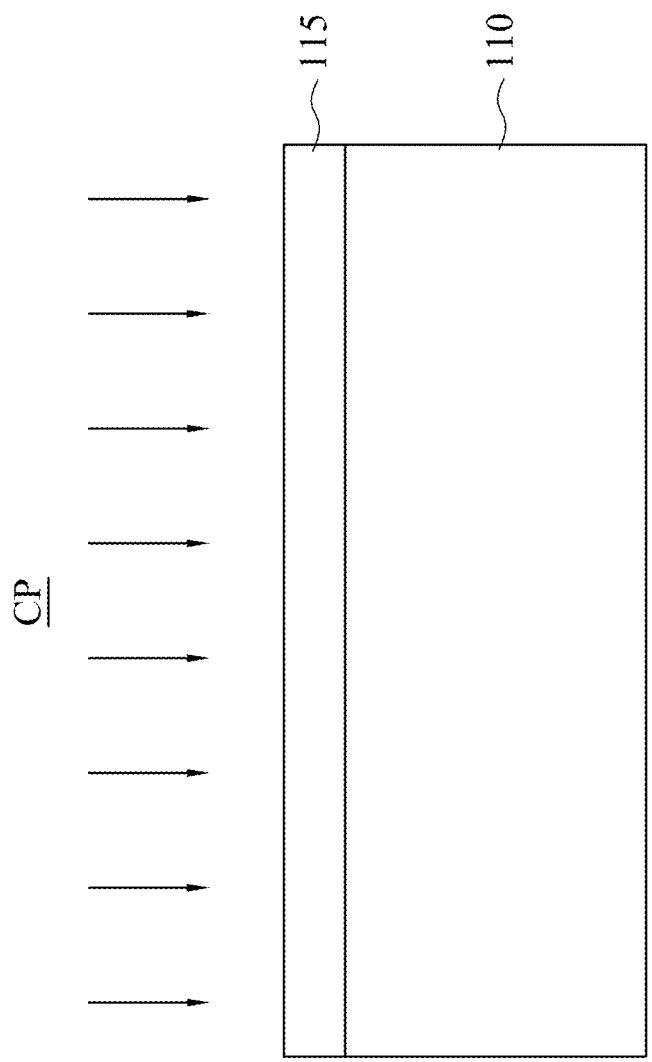

Reference is made to FIG. 12. A cleaning process CP is performed to the substrate 110. In some embodiments, for example, if the substrate 110 is exposed to the air, a native oxide layer 115 may naturally grow on the top surface of the substrate 110. The cleaning process CP is performed to the substrate 110 to prepare it for the formation of gate stacks in a later process. In more detail, to ensure good quality of the gate stacks, native oxide formed on the surfaces of the substrate 110 is removed. The cleaning process CP is configured to remove such native oxide, such as the native oxide layer 115. In some embodiments, the cleaning process CP includes applying diluted hydrofluoric acid (HF) to the surfaces of the substrate 110. In some embodiments, the duration of the cleaning process is in a range from about 50 s to about 70 s (e.g., 60 s).

Figure 13:
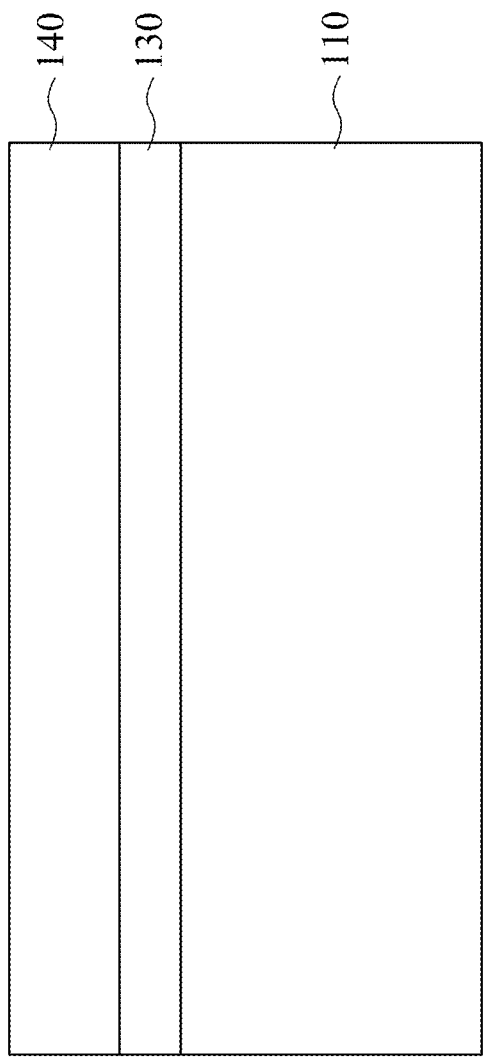

Reference is made to FIG. 13. An interfacial layer 130 is formed over the substrate 110. In some embodiments, the interfacial layer 130 may be a dielectric layer, and may include a dielectric material such as silicon oxide ($SiO_2$), HfSiO, or silicon oxynitride (SiON). In some embodiments where the interfacial layer 130 is made of silicon oxide ($SiO_2$), the interfacial layer 130 may be formed by atomic layer deposition (ALD), wet cleaning, thermal oxidation, and/or other suitable process. In some embodiments where the interfacial layer 130 is made of HfSiO or silicon oxynitride (SiON), the interfacial layer 130 may be formed by ALD, CVD, PVD, and/or other suitable processes.

Next, a QAFE layer 140 is formed over the interfacial layer 130. In some embodiments, the QAFE layer 140 may be formed by atomic layer deposition (ALD), physical vapor deposition PVD), or other suitable deposition processes.

Figure 14:
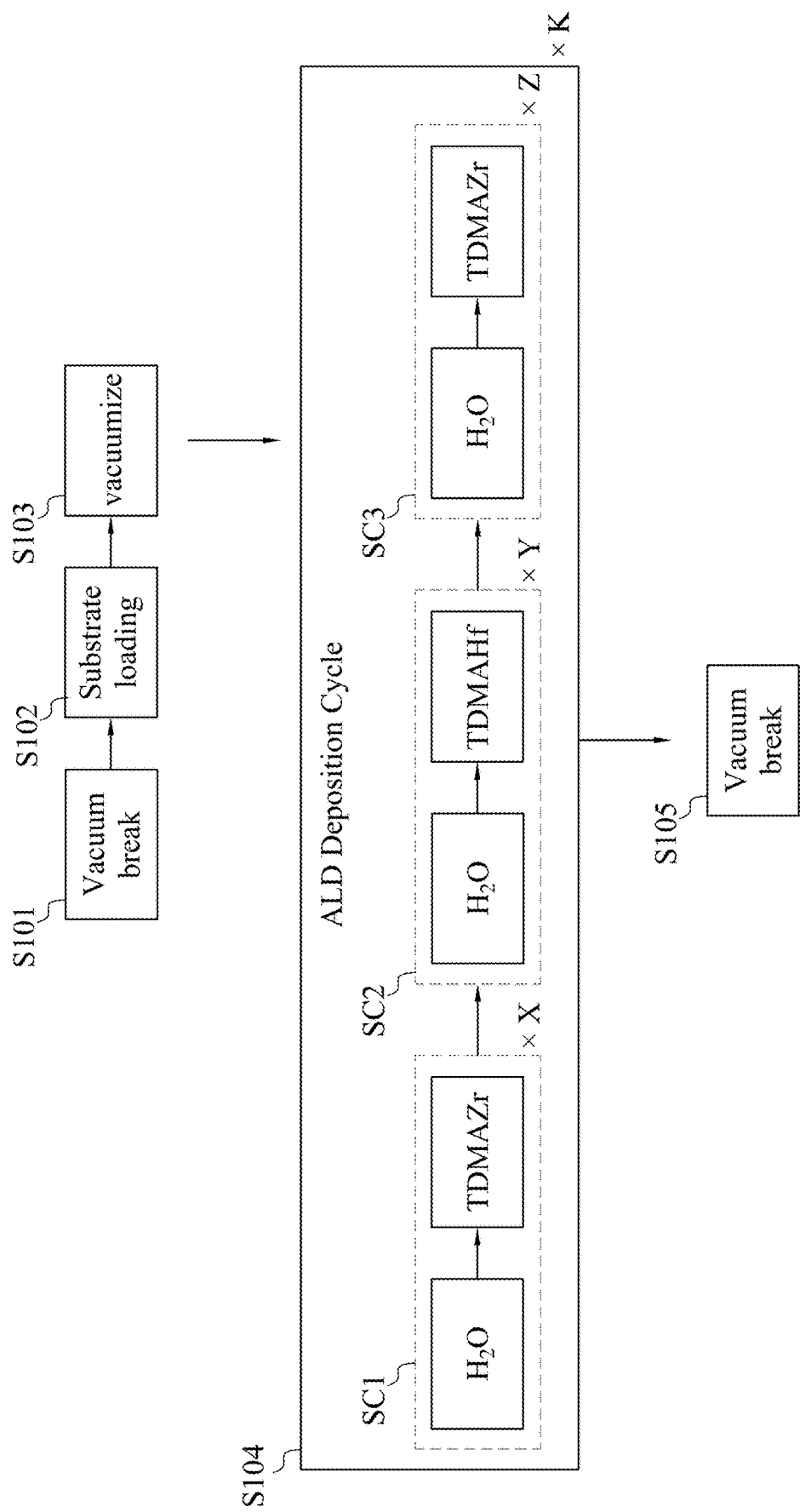

FIG. 14 illustrates a method for forming the QAFE layer 140. In greater detail, FIG. 14 illustrates a method for forming the QAFE layer 140 made of $Hf_{0.25}Zr_{0.75}O_2$ using an ALD process.

In block S101, a first vacuum break process is performed in an ALD chamber. The vacuum break process indicates a process in which a space (e.g., the chamber) is controlled under the atmospheric pressure. In some embodiments, a vacuum controlled break valve (not shown) may be provided to control of gas (e.g., air) entering the chamber, such that the chamber is in under the atmospheric pressure.

In block S102, a substrate is loaded into the ALD chamber. For example, the substrate may be the substrate 110 shown in FIG. 13 with the interfacial layer 130 formed thereon.

In block S103, the ALD chamber is vacuumized. In greater detail, after the substrate is loaded into the ALD chamber, the chamber, in which the ALD deposition takes place, is maintained under vacuum using a suitable vacuum pump (not shown). In some embodiments, a vacuum port is provided for evacuating air from the chamber.

In block S104, an ALD deposition is performed. In some embodiments, each ALD deposition cycle includes several sub-cycles. For example, as shown in block S104, each ALD deposition cycle includes a first sub-cycle SC1, a second sub-cycle SC2, and a third sub-cycle SC3, in which the second sub-cycle SC2 is performed after the first sub-cycle SC1, and the third sub-cycle SC3 is performed after the second sub-cycle SC2.

The first sub-cycle SC1 includes an ALD deposition by supplying precursors of $H_2O$ and tetrakis(dimethylamino) zirconium ($Zr[N(CH_3)_2]_4$; TDMAZr) into the ALD chamber. In some embodiments, the first sub-cycle SC1 may be performed under temperature in a range from about 200° C. to about 300° C., a pressure of $H_2O$ in a range from about 1 mtorr to about 120 mtorr, and a pressure of TDMAZr in a range from about 1 mtorr to about 60 mtorr.

The second sub-cycle SC2 includes an ALD deposition by supplying precursors of $H_2O$ and tetrakis(dimethylamino) hafnium ($Hf[N(CH_3)_2]_4$; TDMAHf) into the ALD chamber. In some embodiments, the second sub-cycle SC2 may be performed under temperature in a range from about 200° C. to about 300° C., a pressure of $H_2O$ in a range from about 1 mtorr to about 120 mtorr, and a pressure of TDMAHf in a range from about 1 mtorr to about 60 mtorr.

The third sub-cycle SC3 includes an ALD deposition by supplying precursors of $H_2O$ and tetrakis(dimethylamino) zirconium ($Zr[N(CH_3)_2]_4$; TDMAZr) into the ALD chamber. In some embodiments, the third sub-cycle SC3 may be performed under temperature in a range from about 200° C. to about 300° C., a pressure of $H_2O$ in a range from about 1 mtorr to about 120 mtorr, and a pressure of TDMAZr in a range from about 1 mtorr to about 60 mtorr.

In some embodiments, the first sub-cycle SC1 and the third sub-cycle SC3 have substantially the same precursors and may be performed under similar condition. In some embodiments, the first sub-cycle SC1 and the third sub-cycle SC3 are the same. The first sub-cycle SC1 and the third sub-cycle SC3 have different precursors from the second sub-cycle SC2. For example, the precursors of the first sub-cycle SC1 and the third sub-cycle SC3 include zirconium (Zr) and do not include hafnium (Hf), while the precursors of the second sub-cycle SC2 includes hafnium (Hf) and does not include zirconium (Zr).

In each ALD deposition cycle, the first sub-cycle SC1 is performed X time(s), the second sub-cycle SC2 is performed Y time(s), and the third sub-cycle SC3 is performed Z time(s). In some embodiments, X:Y:Z is 2:1:1. That is, each ALD cycle includes performing the first sub-cycle SC1 for two times, performing the second sub-cycle SC2 for one time after performing the first sub-cycle SC1 for two times, and performing the third sub-cycle SC3 for one time after performing the second sub-cycle SC2. Stated another way, X is greater than Y and Z, and Y is equal to Z. In some embodiments, X+Z:Y is 3:1. In some other embodiments, X:Y:Z is 1:1:2. That is, each ALD cycle includes performing the first sub-cycle SC1 for one time, performing the second sub-cycle SC2 for one time after performing the first sub-cycle SC1 for one time, and performing the third sub-cycle SC3 for two times after performing the second sub-cycle SC2. Stated another way, Z is greater than X and Y, and X is equal to Y. In some embodiments, X+Z:Y is 3:1.

In some embodiments, the ALD deposition includes performing ALD deposition cycle for K times to achieve a desired thickness of the QAFE layer 140. In some embodiments, K is in a range from about 20 to 30 (e.g., 25), and the resulting thickness of the QAFE layer 140 is in a range from about 8 nm to about 12 nm (e.g., about 10 nm).

In block S105, after the ALD deposition, a second vacuum break process is performed. That is, the pressure in the chamber is adjusted from vacuum to the atmospheric pressure.

Figure 15:
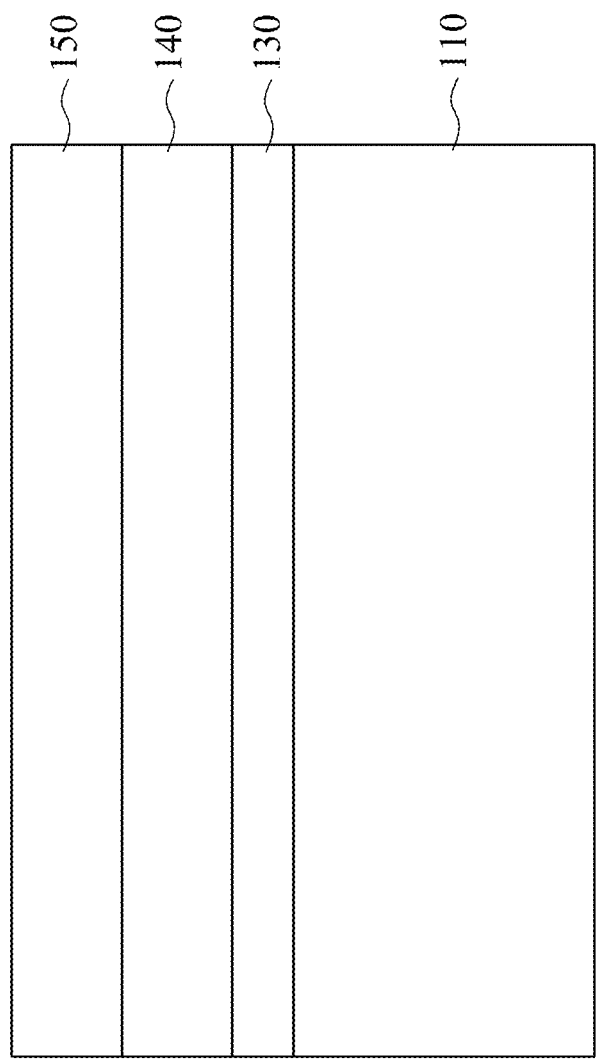

Reference is made to FIG. 15. A gate electrode 150 is formed over the QAFE layer 140. In some embodiments, the gate electrode 150 may be formed by may be formed using PVD, CVD, ALD, plating, a combination thereof, or other suitable technology. In some embodiments, the gate electrode 150 may be formed in-situ in the ALD chamber the same as forming the QAFE layer 140, and the substrate 110 may be moved out from the ALD chamber after the gate electrode 150 is formed.

Figure 16:
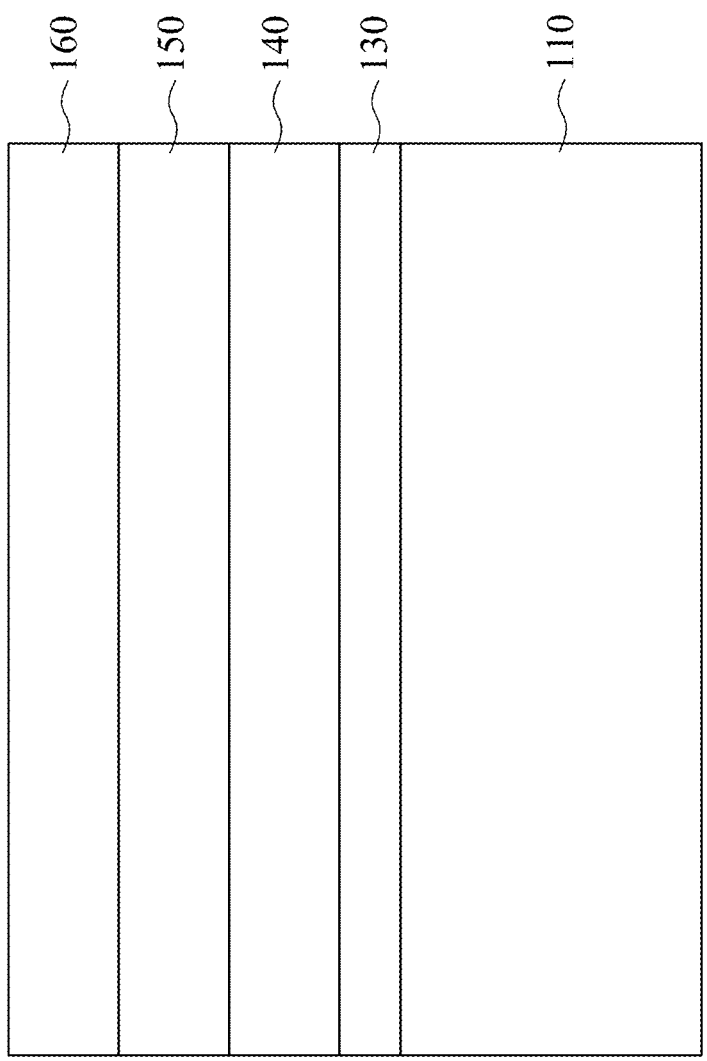

Reference is made to FIG. 16. A photoresist layer 160 is formed over the gate electrode 150. In some embodiments, the photoresist layer 160 may be formed by spin-on coating a liquid polymeric material over the QAFE layer 140. In some embodiments, the photoresist layer 160 includes a photosensitive chemical, a polymeric material having one or more acid labile groups (ALG), and a solvent. The photosensitive chemical may be a photo-acid generator (PAG) that produces an acid upon radiation. The acid cleaves the ALGs off the polymeric material in a chemical amplification reaction. In some embodiments, the photoresist layer 160 may be further treated with a soft baking process and a hard baking process. In some embodiments, the photoresist layer 160 is sensitive to a radiation, such as an I-line light, a DUV light, a EUV light, an e-beam, an x-ray, and an ion beam.

Figure 17:
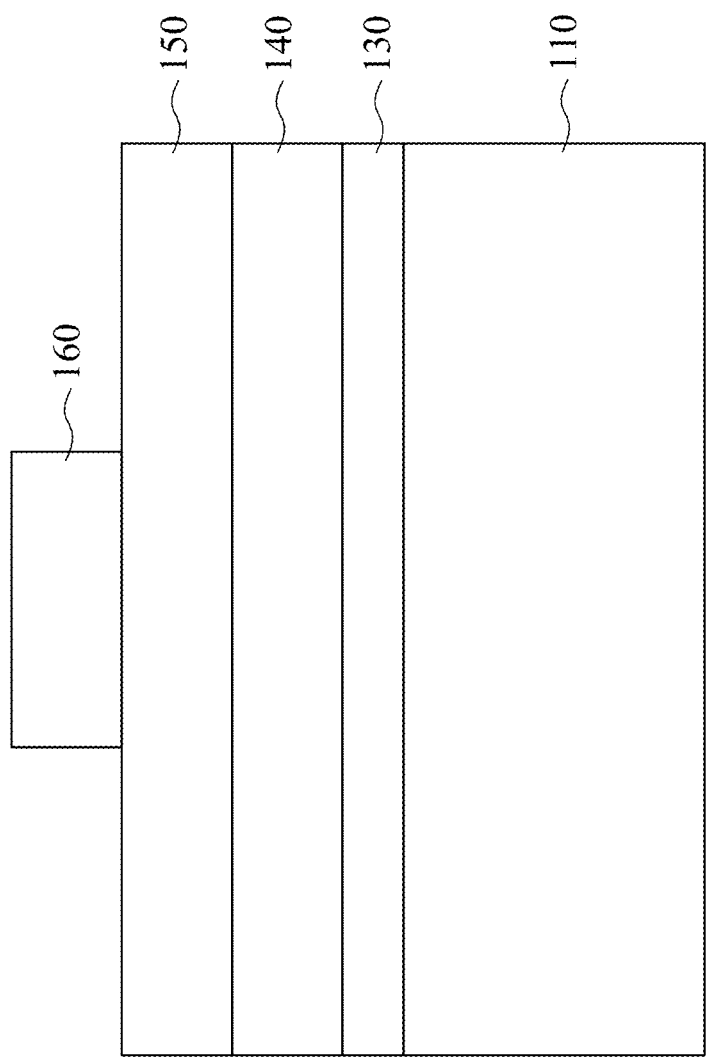

Reference is made to FIG. 17. The photoresist layer 160 is patterned. Accordingly, portions of the top surface of the gate electrode 150 are exposed by the patterned photoresist layer. In some embodiments, the photoresist layer 160 may be formed by exposing the photoresist layer 160 to a radiation beam in a lithography system. For example, some portions of the photoresist layer 160 are exposed by the radiation beam, and other portions of the photoresist layer 160 remain unexposed. The radiation beam may be an I-line light (365 nm), a DUV radiation such as KrF excimer laser (248 nm) or ArF excimer laser (193 nm), a EUV radiation (e.g., 13.5 nm), an e-beam, an x-ray, an ion beam, or other suitable radiations. In some embodiments, the radiation beam is patterned with a mask, such as a transmissive mask or a reflective mask. The mask includes various patterns for forming IC features in or on the substrate.

Figure 18:
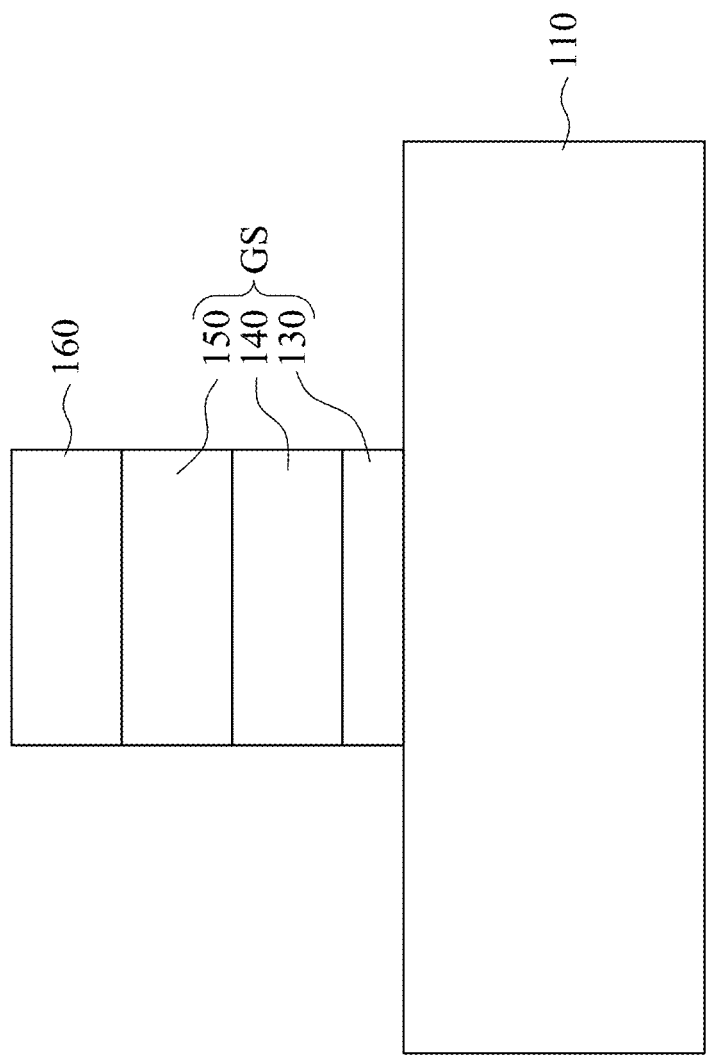

Reference is made to FIG. 18. The gate electrode 150, the QAFE layer 140, and the interfacial layer 130 are etched by using the patterned photoresist layer 160 as an etch mask, thereby transferring the pattern from the patterned photoresist layer 160 to the gate electrode 150, the QAFE layer 140, and the interfacial layer 130. In some embodiments, the etching process may include dry (plasma) etching, a wet etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 19:
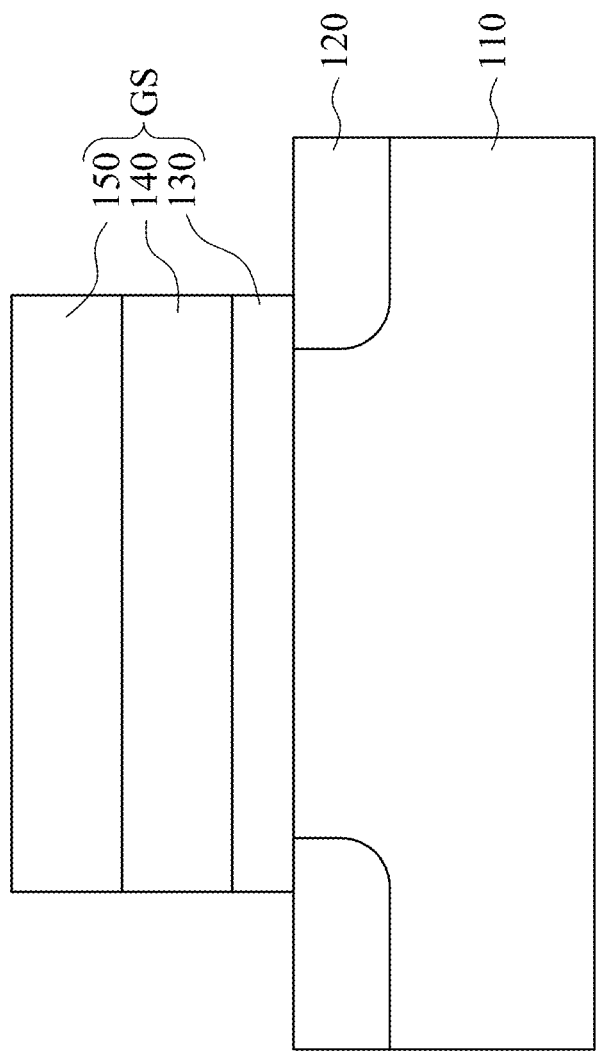

Reference is made to FIG. 19. Source/drain regions 120 are formed in portions of the substrate 110 exposed by the gate electrode 150, the QAFE layer 140, and the interfacial layer 130. Next, the patterned photoresist layer 160 is stripped off, leaving the patterned gate electrode 150, the patterned QAFE layer 140, and the patterned interfacial layer 130 over the substrate 110. In some embodiments, the source/drain regions 120 may be formed by an ion implantation process to drive dopants into the substrate 110, and then performing an annealing process to activate dopants. In some embodiments, the annealing process may utilize rapid thermal annealing (RTA), laser spike annealing (LSA), furnace annealing, microwave annealing, flash annealing, or the like. In some embodiments where the annealing process is a RTA process, the pressure in the RTA chamber is in a range from about 0.001 atm to about 1 atm, the temperature is in a range from about 500° C. to about 1000° C. In some embodiments, the annealing gas is selected from gas that would not react with the material on the substrate 110, such as $N_2$, Ar, He, Ne, Kr, Xe, Rn, or the like. In some embodiments, the source/drain dopants are implanted into the substrate 110 at a tilted angle, which allows for the source/drain regions 120 laterally extending to directly below the interfacial layer 130. In that case, the interfacial layer 130, the QAFE layer 140 and the gate electrode 150 overlap partial regions of the source/drain regions 120.

In some other embodiments where the source/drain regions 120 are epitaxy structures, the source/drain regions 120 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

FIGS. 20 to 26 illustrate a method in various stages of fabricating a NC-FET in accordance with some embodiments of the present disclosure. It is noted that some elements discussed in FIGS. 20 to 26 are similar to those discussed above with respect to FIGS. 1 to 19, and thus relevant details will not be repeated for simplicity.

Figure 20:
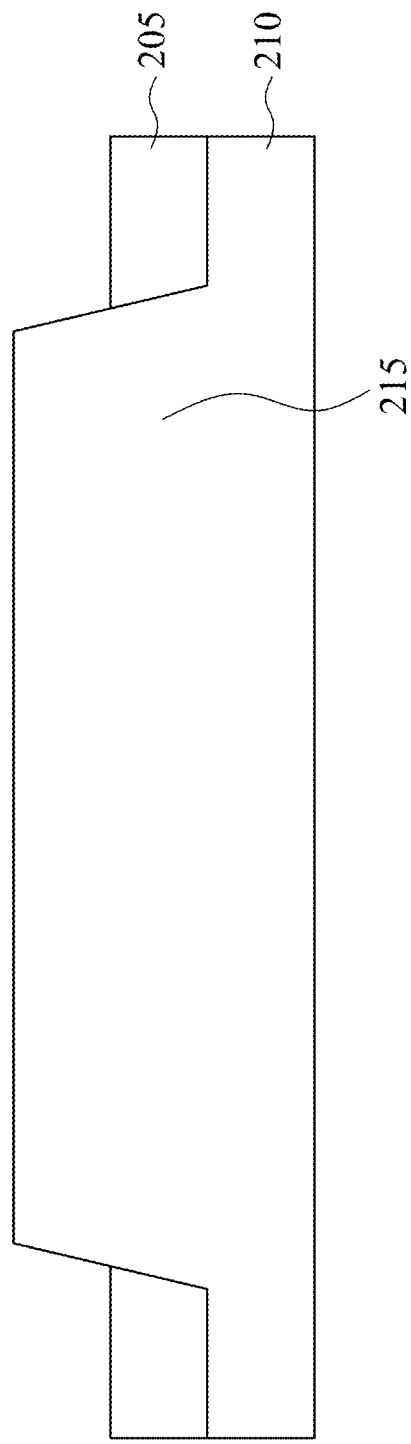
FIGS. 20 to 26 illustrate a method in various stages of fabricating a NC-FET in accordance with some embodiments of the present disclosure.

Reference is made to FIG. 20. A substrate 210 is shown. The substrate 210 includes a semiconductor fin 215 protruding from the top surface of the substrate 210. A plurality of isolation structures 205 are disposed over the substrate 210 and laterally surrounding the semiconductor fin 215. In some embodiments, the semiconductor fin 215 may be formed by patterning the substrate 210, such as removing a portion of the substrate 210 by an etching process, and a remaining portion of the substrate 210 protruding from the top surface of the substrate 210 can be referred to as the semiconductor fin 215. In some embodiments, the isolation structures 205, which act as a shallow trench isolation (STI) around the semiconductor fin 215, may be formed by chemical vapor deposition (CVD) techniques using tetra-ethyl-ortho-silicate (TEOS) and oxygen as a precursor. In some embodiments, the isolation structures 205 may include dielectric material, such a silicon oxide, silicon nitride, or combinations thereof.

Figure 21:
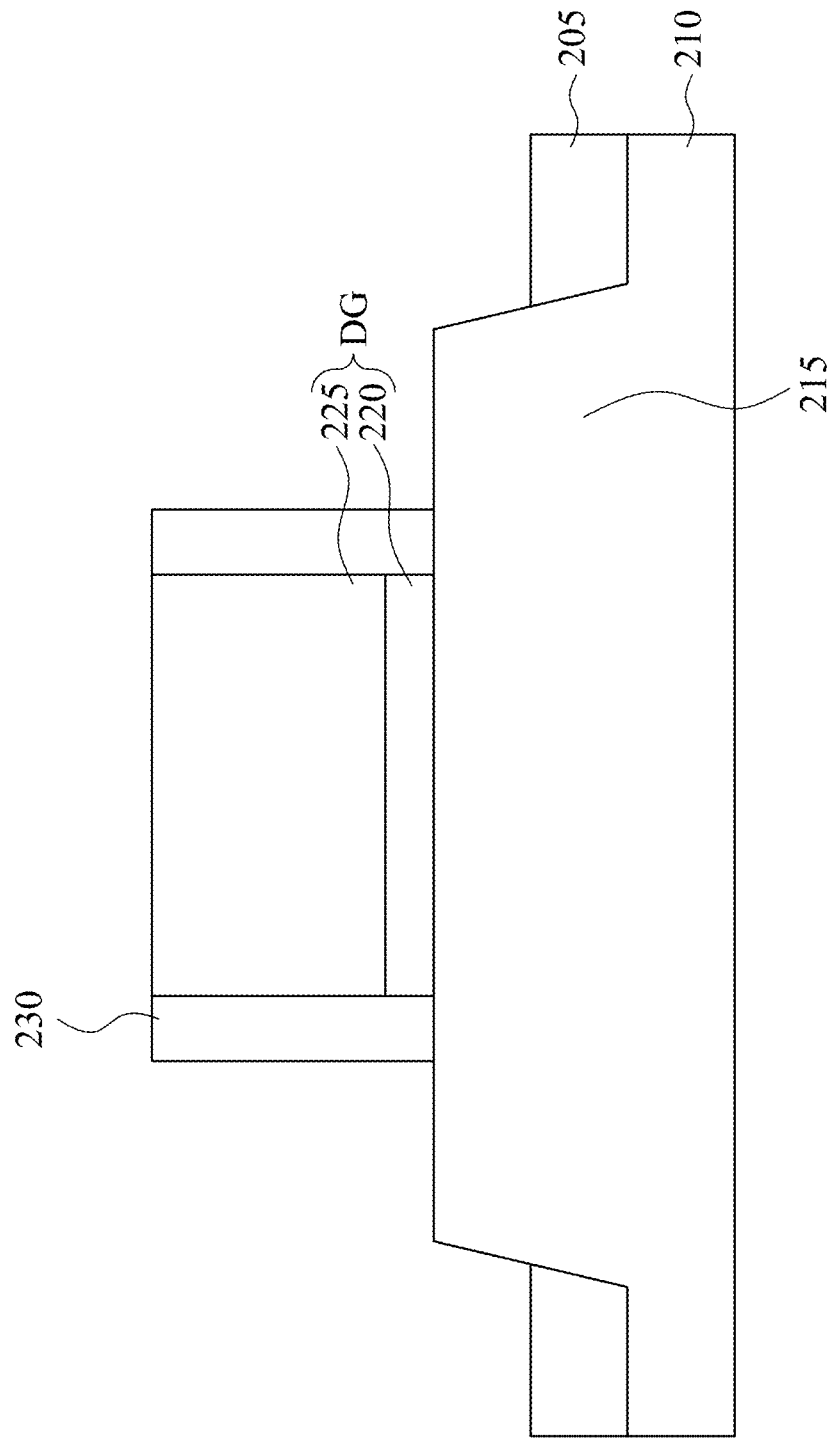

Reference is made to FIG. 21. A gate dielectric layer 220 and a dummy gate layer 225 are formed over the semiconductor fin 215. In some embodiments, the gate dielectric layer 220 and the dummy gate layer 225 can be collectively referred to as dummy gate structure DG. The gate dielectric layer 225 may be, for example, silicon oxide, silicon nitride, a combination thereof, or the like, and may be deposited or thermally grown according to acceptable techniques. In some other embodiments, the gate dielectric layer 220 may be formed by suitable process, such as chemical vapor deposition (CVD), physical vapor deposition (PVD), atomic layer deposition (ALD), or any suitable process. The dummy gate layer 225 may include polycrystalline-silicon (poly-Si) or poly-crystalline silicon-germanium (poly-SiGe). Further, the dummy gate layer 225 may be doped poly-silicon with uniform or non-uniform doping. The dummy gate layer 225 may be formed by suitable process, such as chemical vapor deposition (CVD), physical vapor deposition (PVD), atomic layer deposition (ALD), or any suitable process.

Next, gate spacers 230 are formed on opposite sidewalls of the dummy gate structure DG. The gate spacers 230 may be formed by, for example, depositing a spacer layer blanket over the dummy gate structure DG, followed by an anisotropic etching process to remove horizontal portions of the spacer layer, such that vertical portions of the spacer layer remain on sidewalls of the dummy gate structure DG. In some embodiments, the gate spacers 230 may be formed by CVD, SACVD, flowable CVD, ALD, PVD, or other suitable process.

Figure 22:
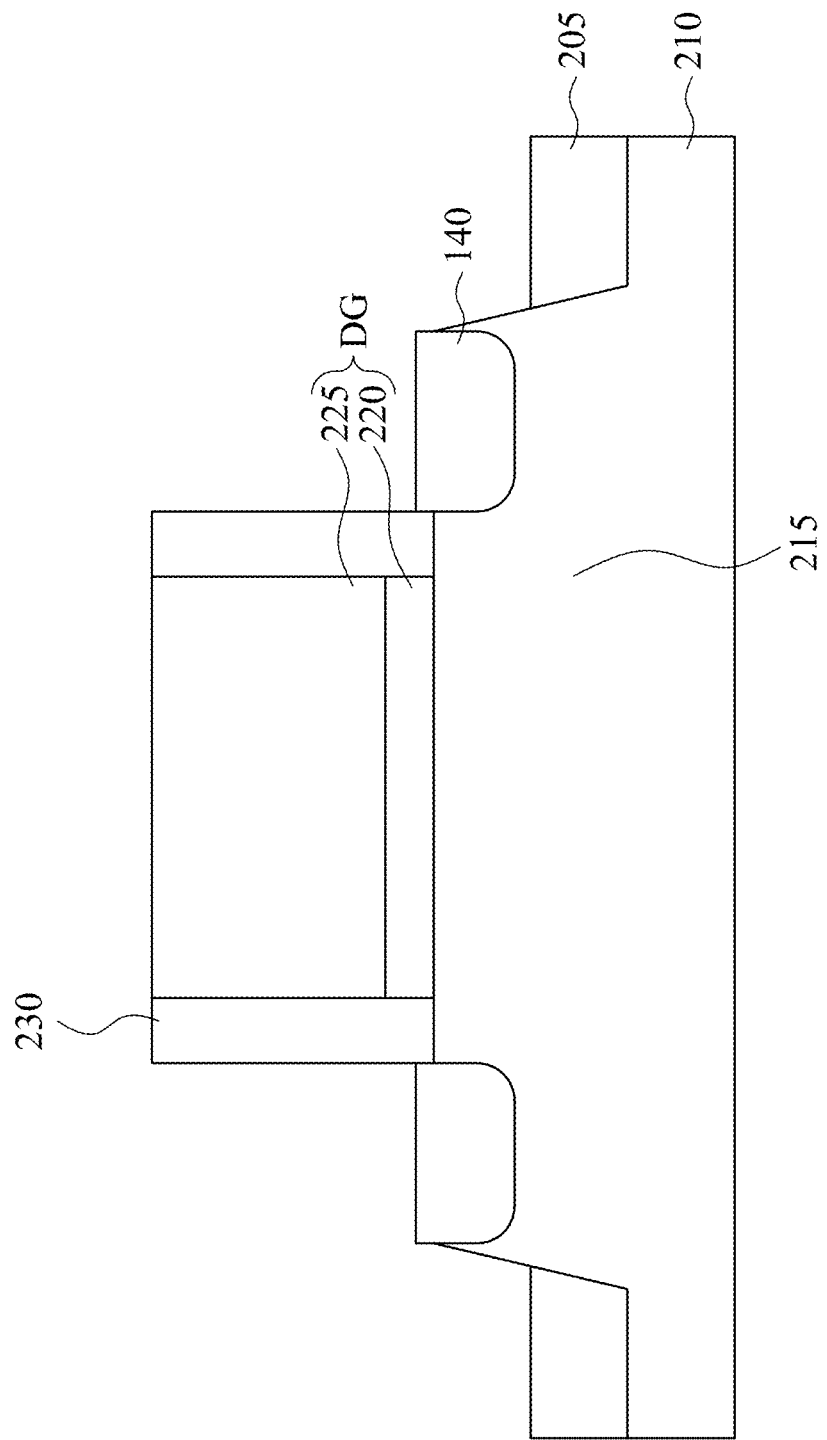

Reference is made to FIG. 22. Source/drain structures 240 are formed in the semiconductor fin 215 exposed by the dummy gate structure DG and the gate spacers 230. For example, the exposed portions of the semiconductor fin 215 exposed by the dummy gate structure DG and the gate spacers 230 are recessed by suitable process, such as etching. Afterwards, the source/drain structures 240 are formed respectively over the exposed surfaces of the remaining semiconductor fin 215. The source/drain structures 240 may be formed by performing an epitaxial growth process that provides an epitaxy material over the semiconductor fin 215.

Figure 23:
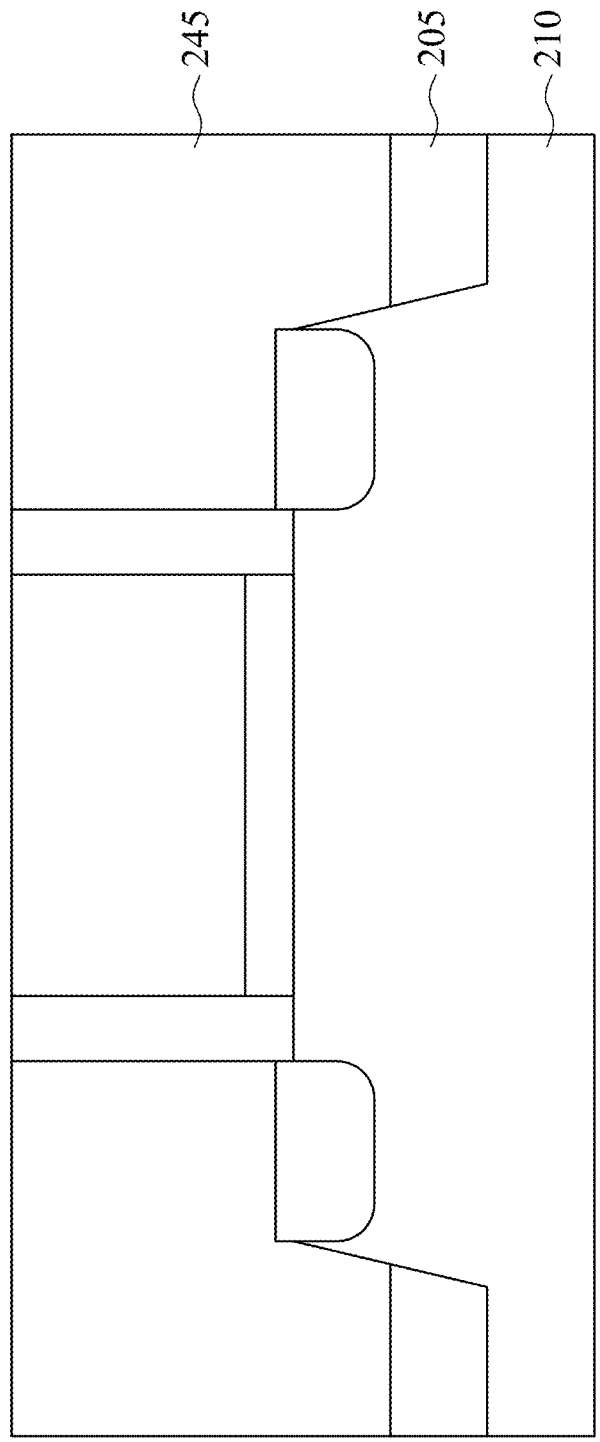

Reference is made to FIG. 23. An interlayer dielectric (ILD) layer 245 is formed over the source/drain structures 240 and laterally surrounding the dummy gate structure DG. For example, an ILD material may be deposited over the substrate 210, and performing a CMP process to remove excessive ILD material until the top surface of the dummy gate structure DG is exposed. The ILD layer 245 may be formed using, for example, CVD, ALD, spin-on-glass (SOG) or other suitable techniques. In some embodiments, the ILD layer 245 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, a contact etch stop layer (not shown), which includes silicon nitride, silicon oxynitride or other suitable materials, may be formed over the source/drain structure 240 prior to forming the ILD layer.

Figure 24:
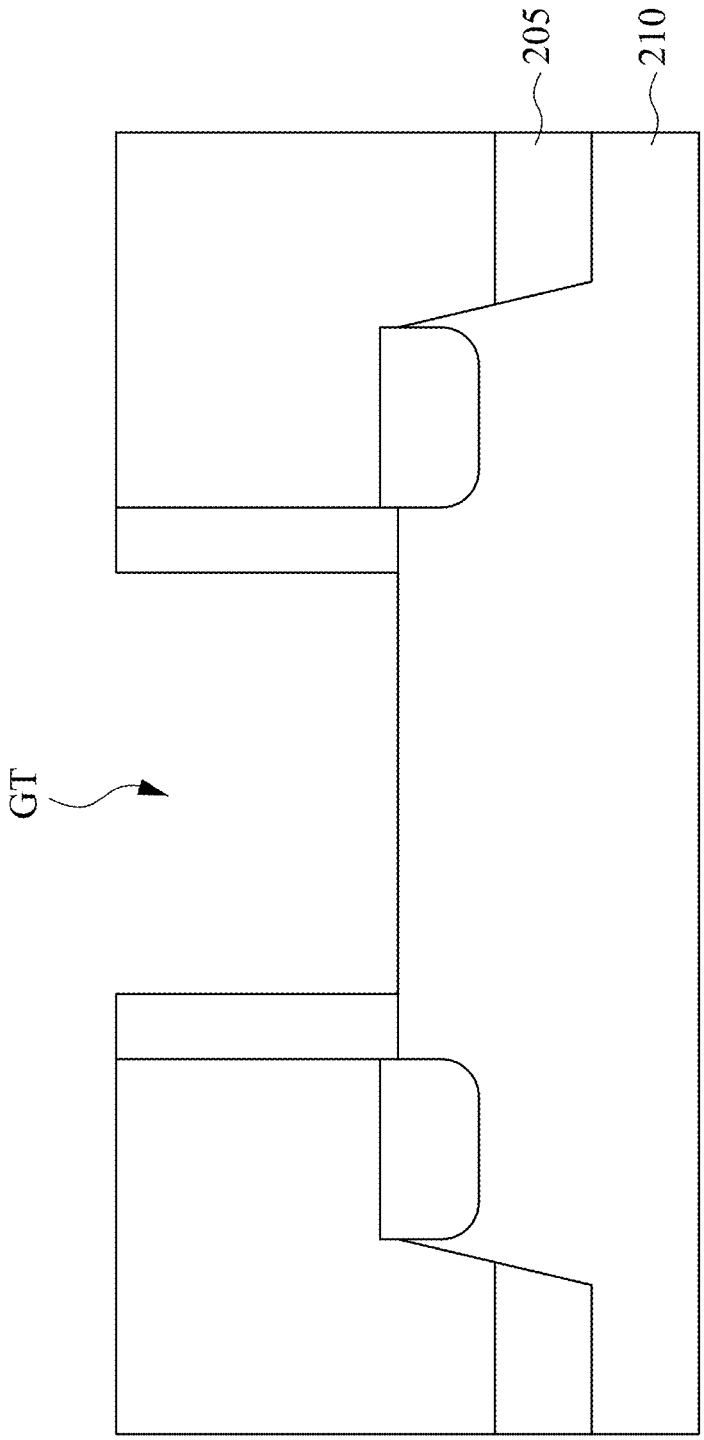

Reference is made to FIG. 24. The dummy gate structure DG is removed to from a gate trench GT between the gate spacers 230. In some embodiments, the dummy gate structure DG may be removed by suitable process, such as an etching process. In some embodiments, a cleaning process, such as the cleaning process CP discussed in FIG. 12 may be performed to the semiconductor fin 215 to remove native oxide from the exposed surface of the semiconductor fin 215.

Figure 25:
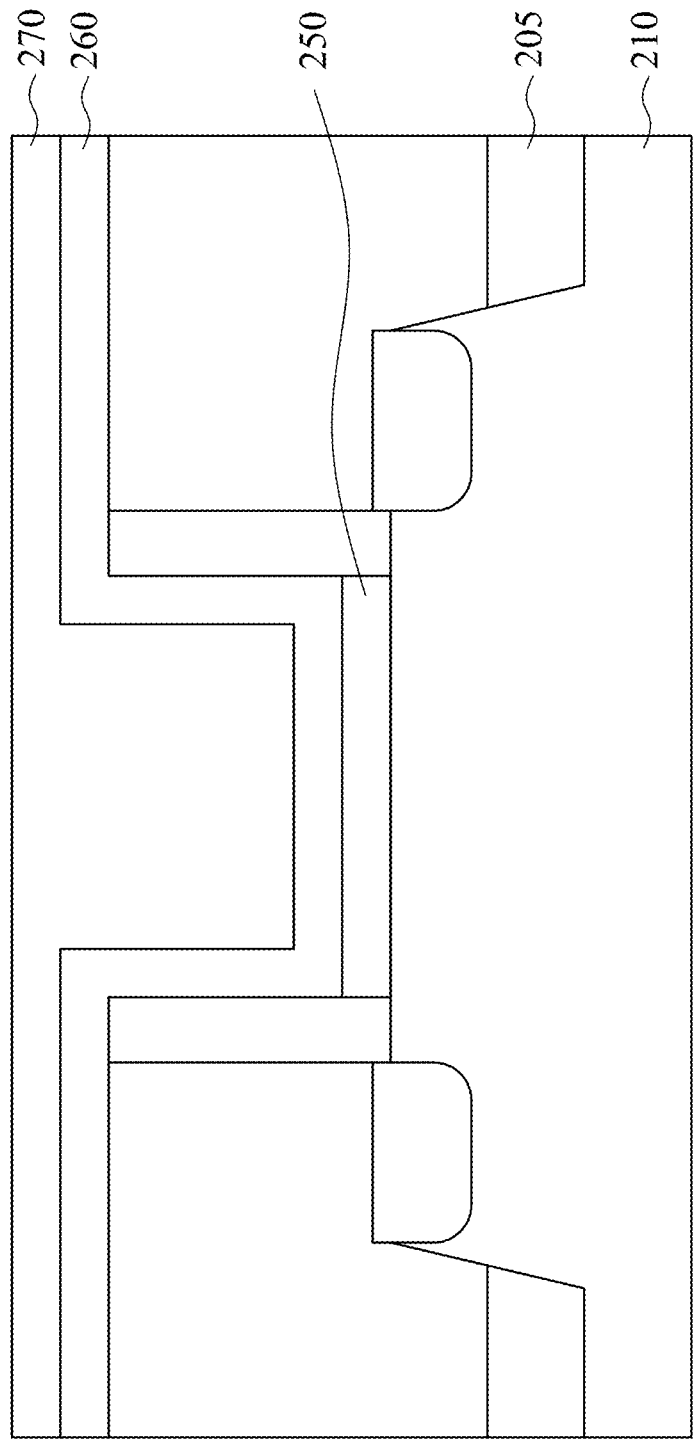

Reference is made to FIG. 25. An interfacial layer 250, a QAFE layer 260, and a gate electrode 270 are sequentially formed in the gate trench GT and over the semiconductor fin 215. In some embodiments, the material and the formation method of the interfacial layer 250, a QAFE layer 260, and a gate electrode 270 may be similar to the material and the formation method of the interfacial layer 130, a QAFE layer 140, and a gate electrode 150 as discussed above with respect to FIGS. 1 to 19. In particular, the QAFE layer 260 may be formed by the method discussed in FIG. 14.

Figure 26:
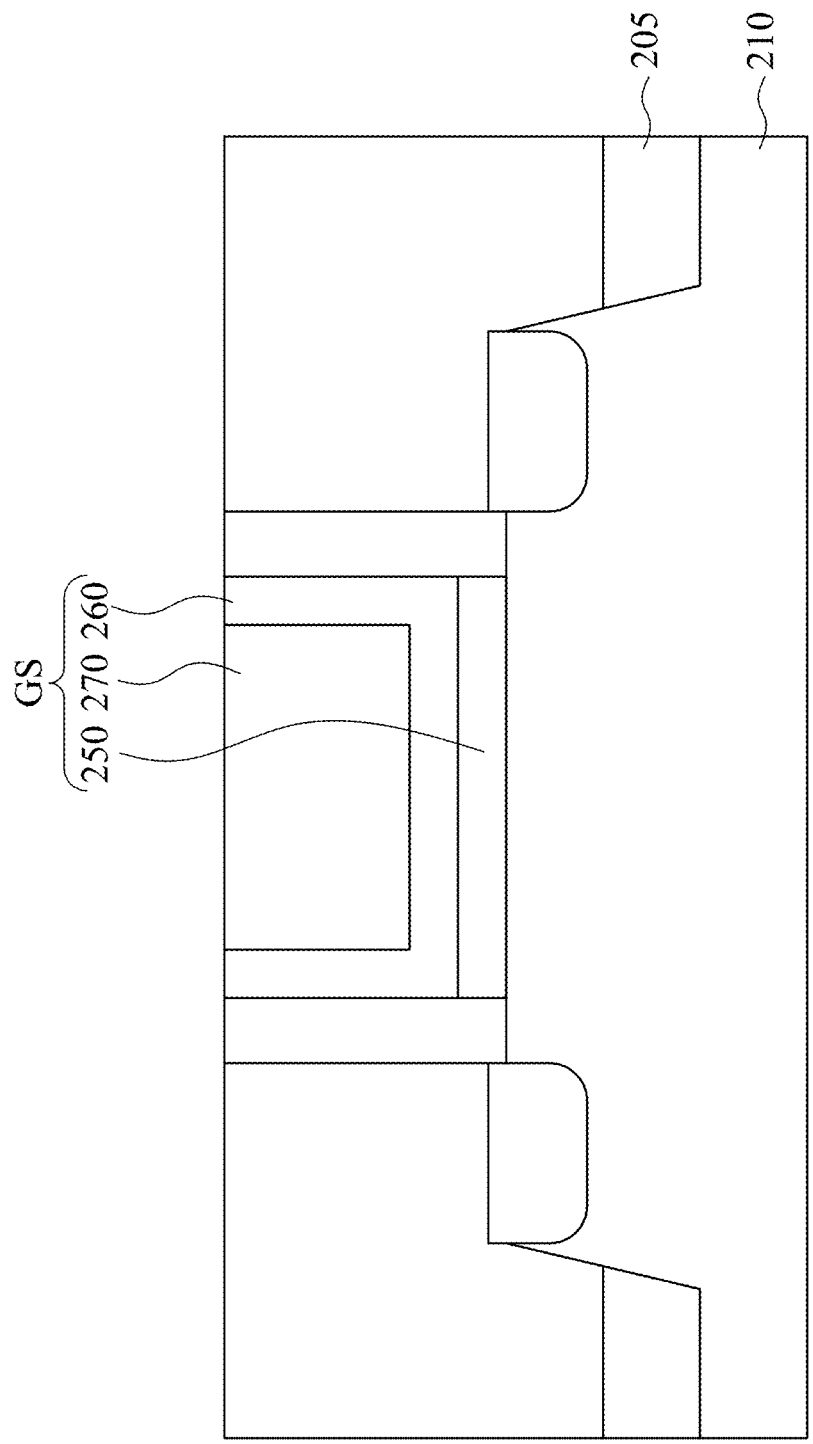

Reference is made to FIG. 26. A CMP process is performed to the QAFE layer 260 and the gate electrode 270 until the top surface of the ILD layer 245 is exposed. In some embodiments, the remaining portions of the interfacial layer 250, the QAFE layer 260, and the gate electrode 270 are referred to as metal gate structure GS.

FIGS. 27 to 36 illustrate a method in various stages of fabricating a NC-FET in accordance with some embodiments of the present disclosure. It is noted that some elements discussed in FIGS. 27 to 36 are similar to those discussed above with respect to FIGS. 1 to 19 and FIGS. 20 to 26, and thus relevant details will not be repeated for simplicity.

Figure 27:
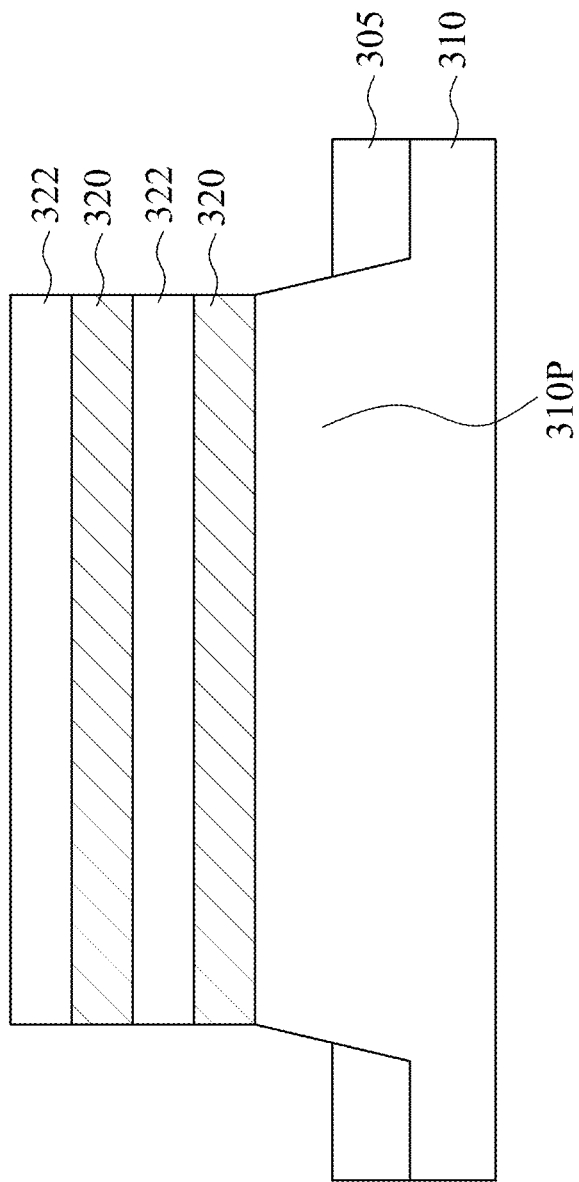
FIGS. 27 to 36 illustrate a method in various stages of fabricating a NC-FET in accordance with some embodiments of the present disclosure.

Reference is made to FIG. 27. A substrate 310 is shown. The substrate 310 includes a protruding portion 310P protruding from the top surface of the substrate 310. A plurality of first semiconductor layers 320 and second semiconductor layers 322 are alternately stacked over the protruding portion 310P of the substrate 310. A plurality of isolation structures 305 are disposed over the substrate 310 and laterally surrounding the protruding portion 310P of the substrate 310. Because the second semiconductor layers 322 are suspended over the semiconductor layers 320 and form a wire-like or a sheet-like structure, the semiconductor layers 322 can also be referred to as "nanowires" or "nanosheets" in this content.

In some embodiments, the first semiconductor layers 320, the second semiconductor layers 322, and the protruding portion 310P may be formed by, for example, alternately depositing first semiconductor materials and second semiconductor materials over the substrate 310, forming a patterned mask (not shown) that defines positions of the first semiconductor layers 320 and the second semiconductor layers 322 over the topmost second semiconductor material, and performing an etching process to remove portions of the first semiconductor materials, the second semiconductor materials, and the substrate 310. The remaining portions of the first semiconductor materials, the second semiconductor materials, and the substrate 310 are referred to as the first semiconductor layers 320, the second semiconductor layers 322, and the protruding portion 310P. In some embodiments, the first semiconductor layers 320, the second semiconductor layers 322, and the protruding portion 310P form a fin-like structure, and thus the first semiconductor layers 320, the second semiconductor layers 322, and the protruding portion 310P can be referred to as a "fin structure."

The first semiconductor layers 320 and the second semiconductor layers 322 have different materials and/or components, such that the first semiconductor layers 320 and the second semiconductor layers 322 have different etching rates. In some embodiments, the first semiconductor layers 320 are made from SiGe. The germanium percentage (atomic percentage concentration) of the first semiconductor layers 320 is in the range between about 10 percent and about 20 percent, while higher or lower germanium percentages may be used. It is appreciated, however, that the values recited throughout the description are examples, and may be changed to different values. For example, the first semiconductor layers 320 may be $Si_{0.8}Ge_{0.2}$ or $Si_{0.9}Ge_{0.1}$, the proportion between Si and Ge may vary from embodiments, and the disclosure is not limited thereto. The second semiconductor layers 322 may be pure silicon layers that are free from germanium. The second semiconductor layers 322 may also be substantially pure silicon layers, for example, with a germanium percentage lower than about 1 percent. In some embodiments, the first semiconductor layers 320 have a higher germanium atomic percentage concentration than the second semiconductor layers 322. In some other embodiments, the second semiconductor layers 322 and the substrate 100 may be made from the same material or different materials. The first semiconductor layers 320 and the second semiconductor layers 322 may be formed by chemical vapor deposition (CVD), molecular beam epitaxy (MBE), or other suitable process(es). In some embodiments, the first semiconductor layers 320 and the second semiconductor layers 322 are formed by an epitaxy growth process, and thus the first semiconductor layers 320 and the second semiconductor layers 322 can also be referred to as epitaxial layers in this content.

Figure 28:
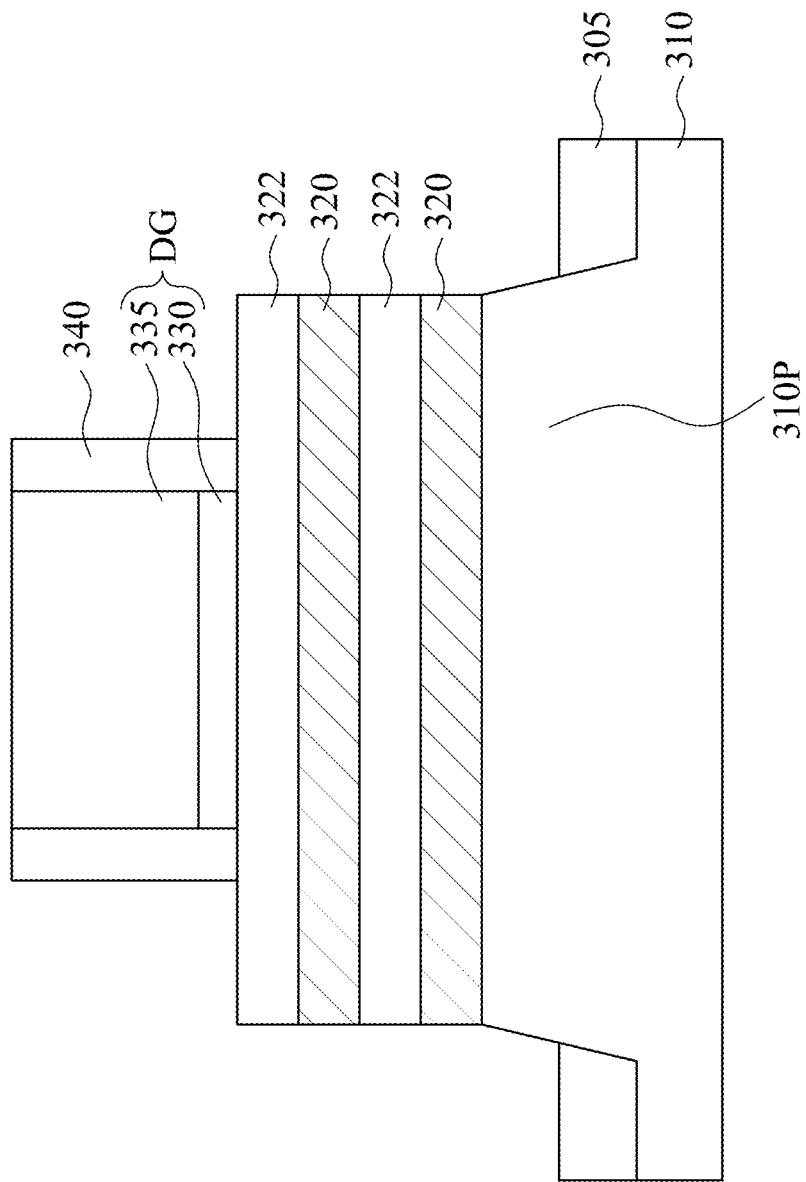

Reference is made to FIG. 28. A gate dielectric layer 330 and a dummy gate layer 335 are formed over the topmost second semiconductor layer 322. In some embodiments, the gate dielectric layer 330 and the dummy gate layer 335 may be collectively referred to as dummy gate structure DG. Next, gate spacers 340 are formed on opposite sidewalls of the dummy gate structure DG.

Figure 29:
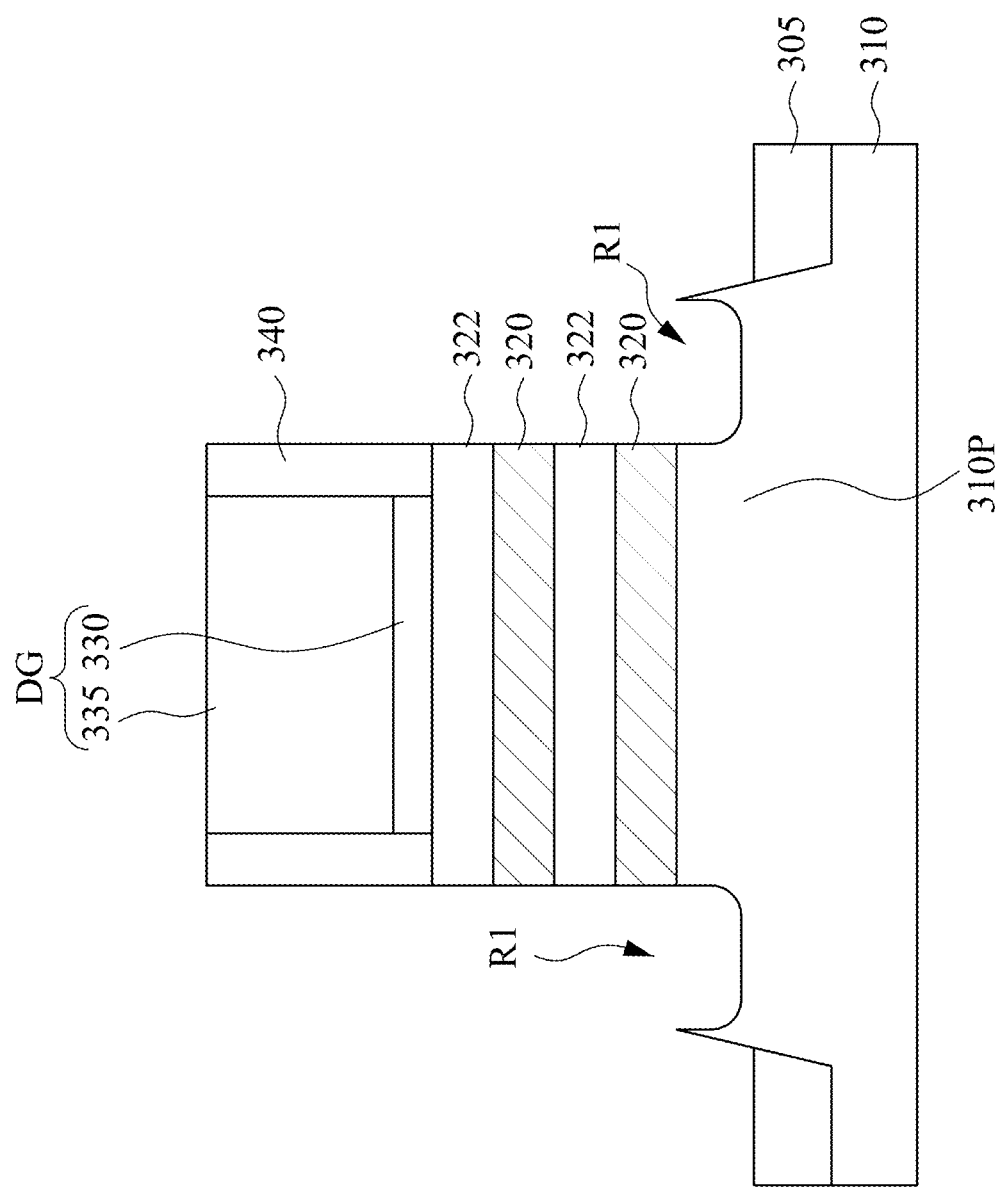

Reference is made to FIG. 29. An etching process is performed to remove portions of the first semiconductor layers 320, the second semiconductor layers 322, and the protruding portion 310P, so as to form recesses R1 on opposite sides of the dummy gate structure DG. After the etching process, sidewalls of the first semiconductor layers 320 and the second semiconductor layers 322 are exposed by the recesses R1. In some embodiments, the etching process includes dry etch, wet etch, or combinations thereof. In some embodiments, the etchants for etching the first semiconductor layers 320 and the second semiconductor layers 322 may include a hydro fluoride (HF), fluoride ($F_2$), ammonium hydroxide ($NH_4OH$), or combinations thereof.

Figure 30:
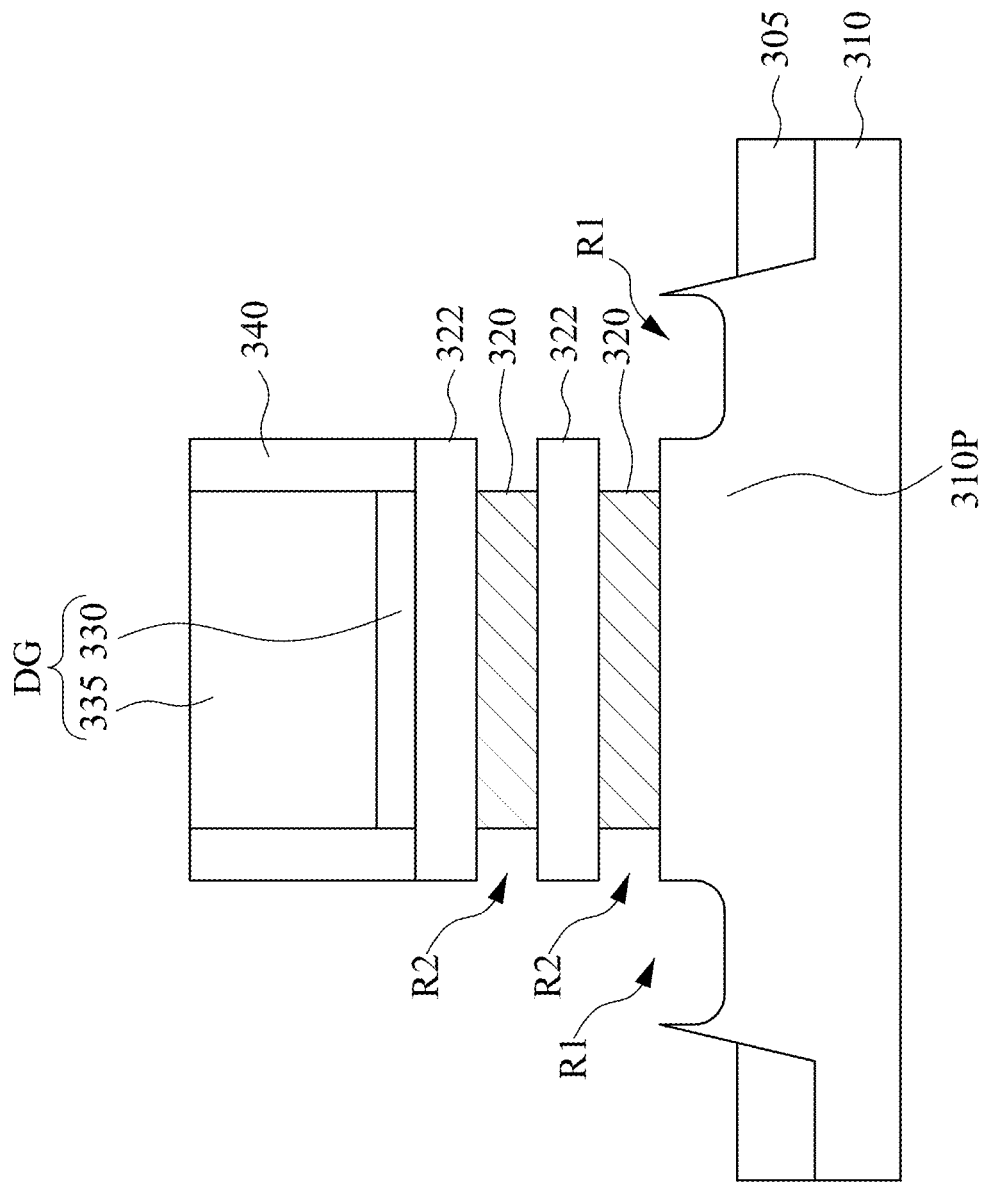

Reference is made to FIG. 30. The first semiconductor layers 320 are horizontally recessed to form a plurality of recesses R2 between the second semiconductor layers 322. In some embodiments, the first semiconductor layers 320 are etched to narrower the first semiconductor layers 320 in the horizontal direction. In some embodiments, the etching process has etching selectivity to the semiconductor layers 320 and 322. For example, the second semiconductor layers 322 have higher etching resistance to the etching process than the first semiconductor layers 320. Stated another way, the etching process etches the first semiconductor layers 320 at a faster rate than etching the second semiconductor layers 322. When the first semiconductor layers 320 are Ge or SiGe and the second semiconductor layers 322 are Si, the first semiconductor layers 320 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

Figure 31:
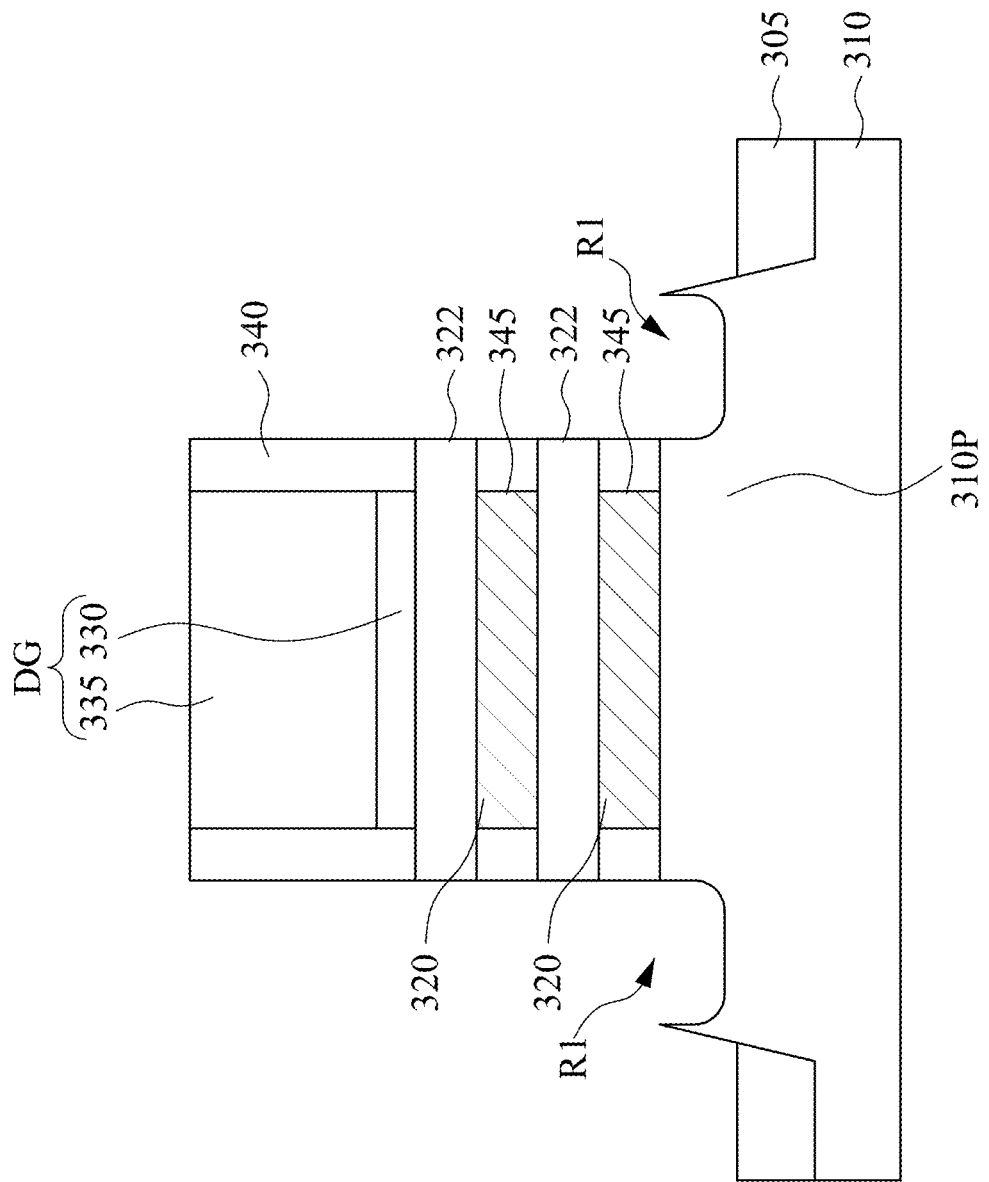

Reference is made to FIG. 31. Inner spacers 345 are formed in the recesses R2. In some embodiments, the material of the inner spacers 345 may be low-k material, such as SiO, SiN, SiON, SiCN, SiOC, SiOCN, or the like. The inner spacers 345 can be formed by ALD or other suitable methods. In some embodiments, the inner spacers 345 may be formed by, for example, conformally depositing an inner spacer layer in the recesses R1 and fills the recesses R2, and performing an etching process to remove portions of the inner spacer layer outside the recesses R2, such that portions of the inner spacer layer in the recesses R2 remain after the etching process.

Figure 32:
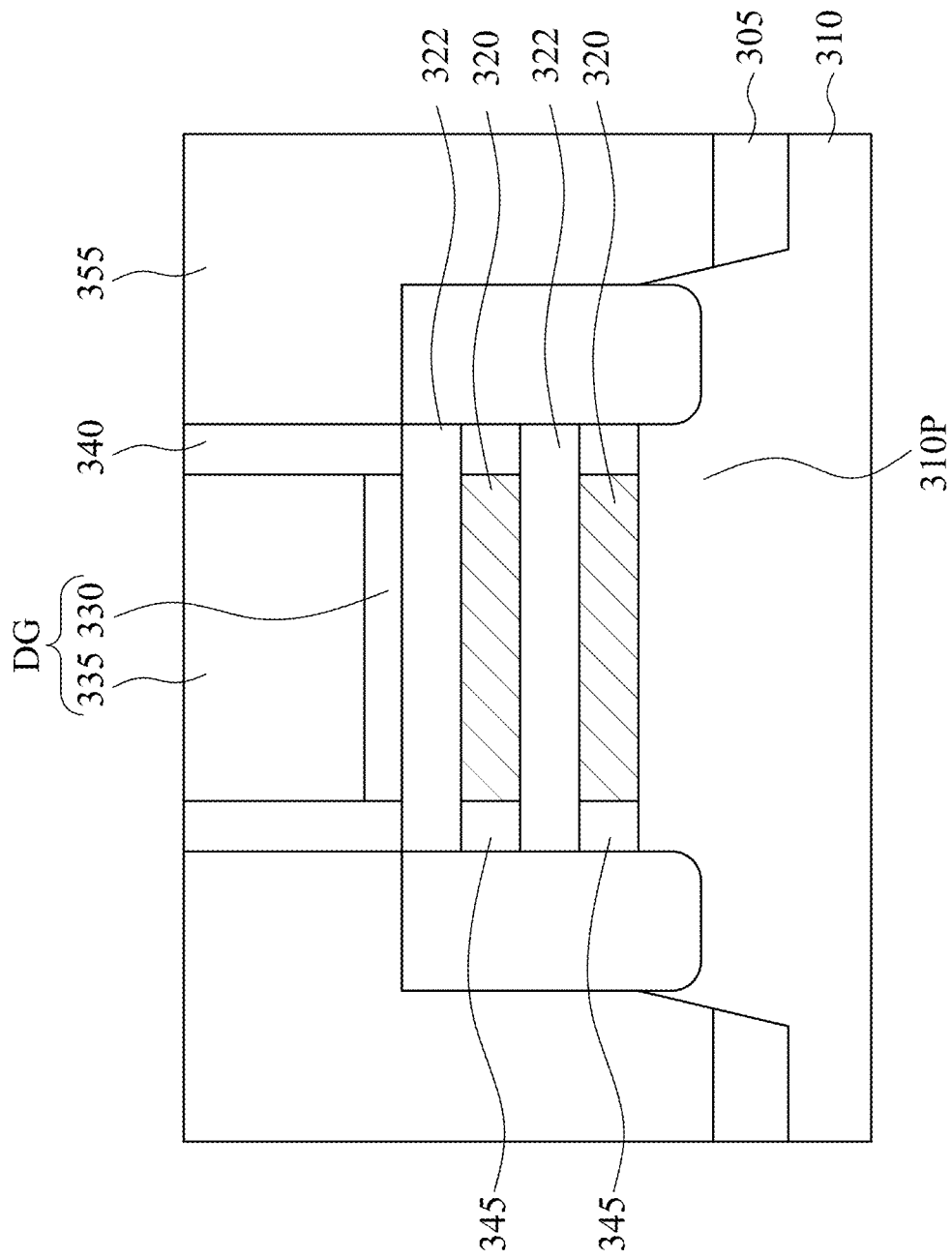

Reference is made to FIG. 32. Source/drain structures 350 are formed in the recesses R1. Afterwards, an interlayer dielectric (ILD) layer 355 is formed over the source/drain structures 350 and laterally surrounding the dummy gate structure DG.

Figure 33:
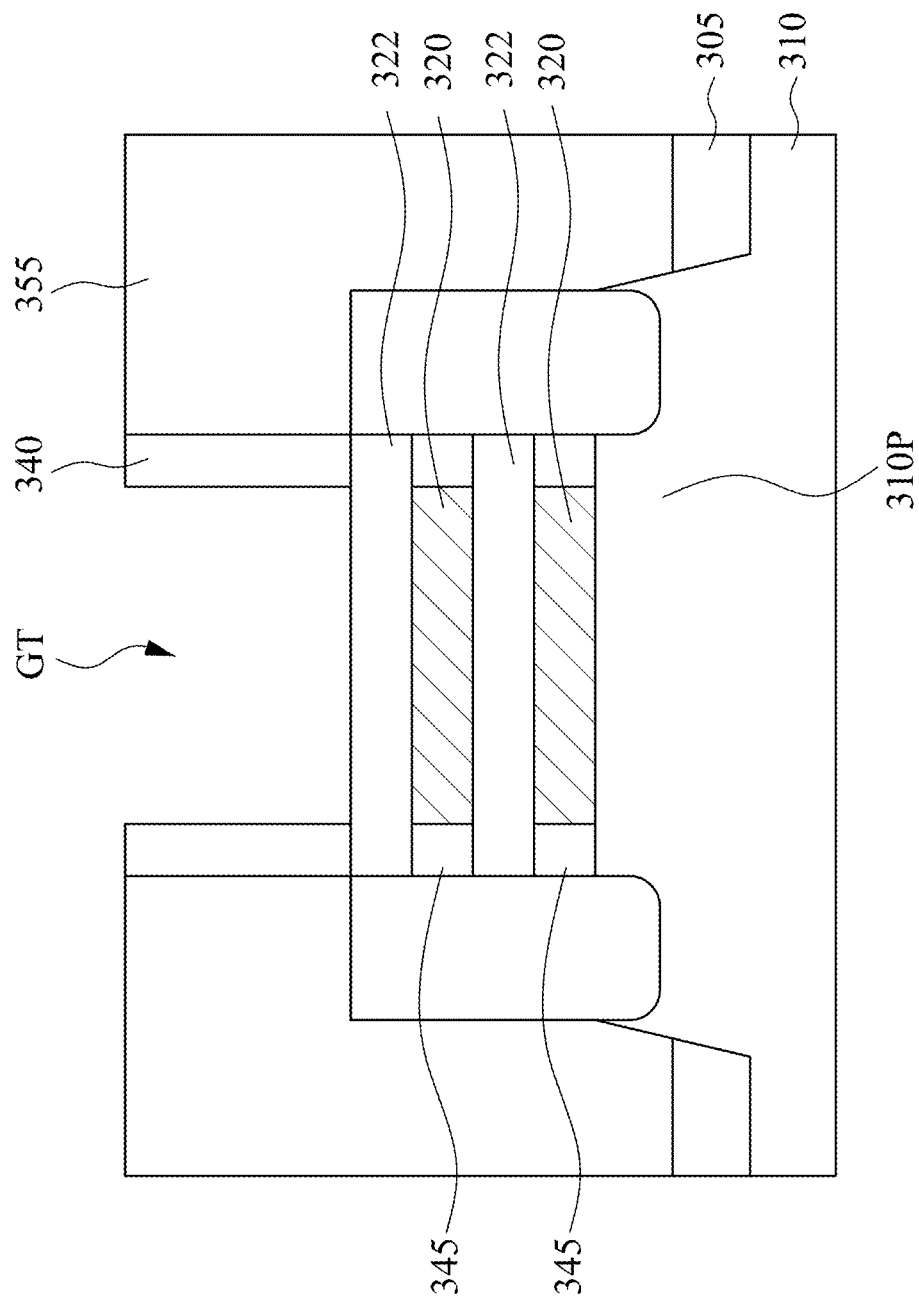

Reference is made to FIG. 33. The dummy gate structure DG is removed to from a gate trench GT between the gate spacers 340. After the dummy gate structure DG is removed, the first semiconductor layers 320 and second semiconductor layers 322 are exposed.

Figure 34:
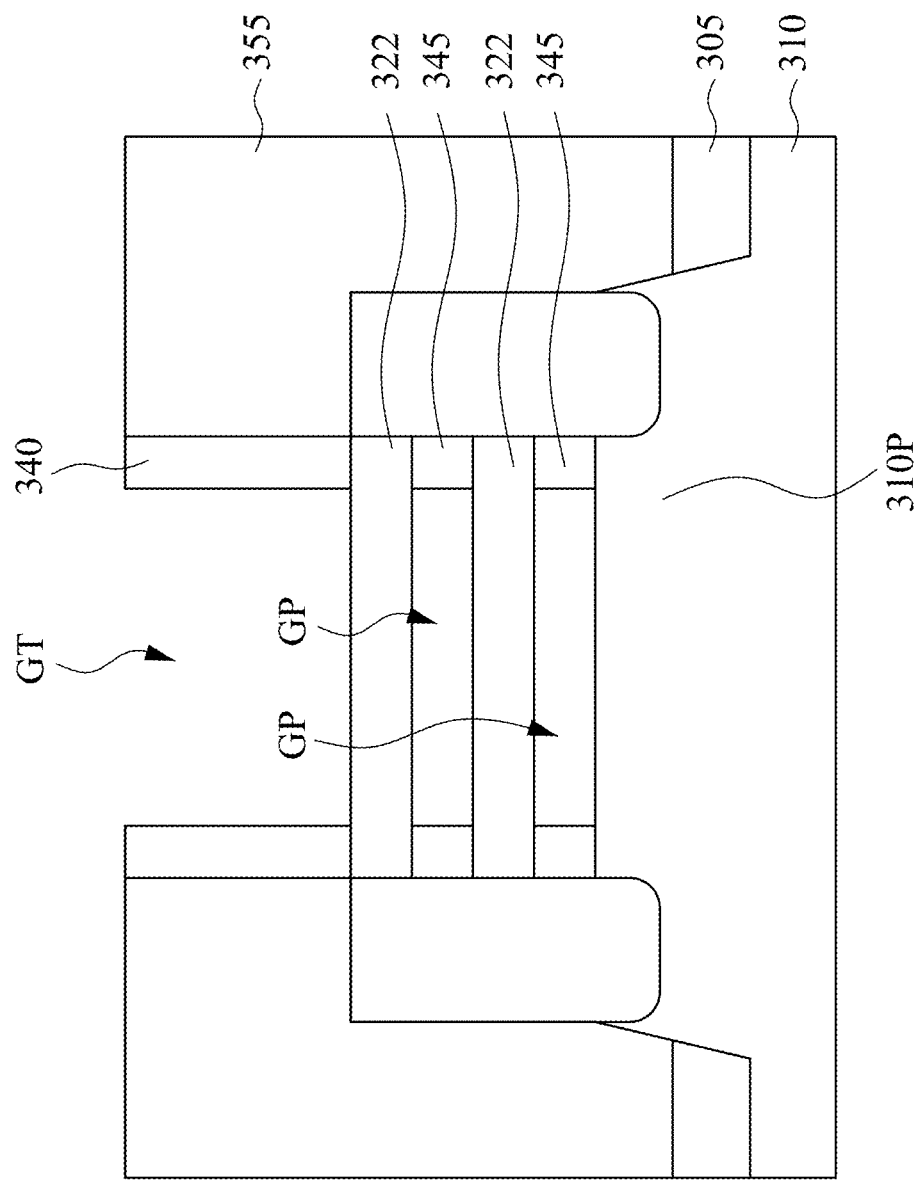

Reference is made to FIG. 34. The first semiconductor layers 320 are removed through the gate trench GT, so as to form gaps GP between the second semiconductor layers 322 and between the bottommost second semiconductor layer 320 and the protruding portion 310P of the substrate 310. In some embodiments, the etching process has etching selectivity to the semiconductor layers 320 and 322. For example, the second semiconductor layers 322 have higher etching resistance to the etching process than the first semiconductor layers 320. Stated another way, the etching process etches the first semiconductor layers 320 at a faster rate than etching the second semiconductor layers 322.

Figure 35:
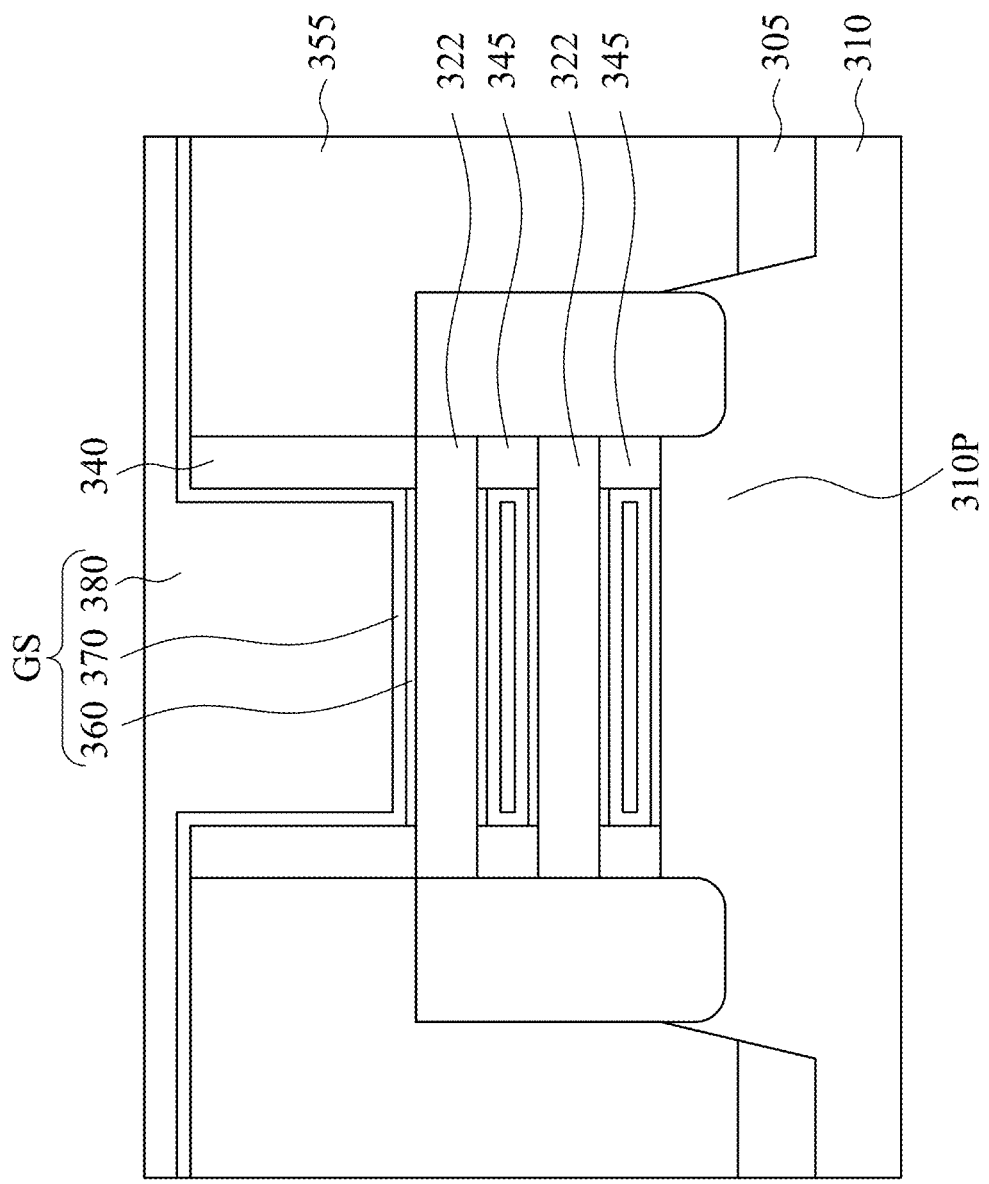

Reference is made to FIG. 35. An interfacial layer 360, a QAFE layer 370, and a gate electrode 380 are sequentially formed in the gate trench GT and in the gaps GP. In some embodiments, the material and the formation method of the interfacial layer 360, a QAFE layer 370, and a gate electrode 380 may be similar to the material and the formation method of the interfacial layer 130, a QAFE layer 140, and a gate electrode 150 as discussed above with respect to FIGS. 1 to 19. In particular, the QAFE layer 370 may be formed by the method discussed in FIG. 14.

Figure 36:
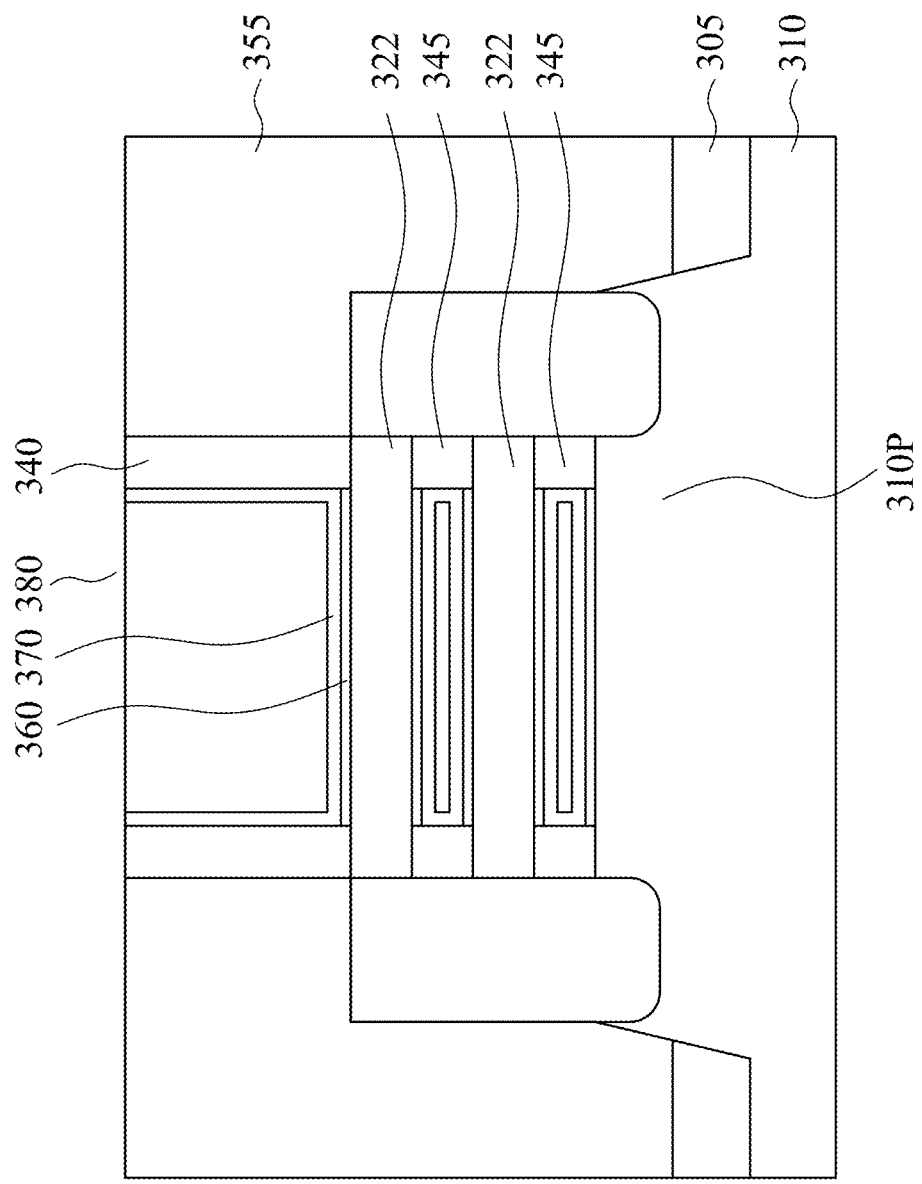

Reference is made to FIG. 36. A CMP process is performed to the QAFE layer 360 and the gate electrode 380 until the top surface of the ILD layer 355 is exposed. In some embodiments, the remaining portions of the interfacial layer 360, the QAFE layer 370, and the gate electrode 380 are referred to as metal gate structure GS. In some embodiments, the QAFE layer 360 is in contact with sidewalls of the inner spacers 345.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a QAFE layer is used in an NC-FET, and the QAFE material allows the NC-FET operates at steep subthreshold swing (e.g., lower than 60 mV/decade) but has no hysteresis or negligible hysteresis.

In some embodiments of the present disclosure, a semiconductor device includes a substrate, a gate structure over the substrate, and source/drain regions in the substrate and on opposite sides of the gate structure. The gate structure includes an interfacial layer, a quasi-antiferroelectric (QAFE) layer over the interfacial layer, and a gate electrode over the QAFE layer. The QAFE layer includes $Hf_{1-x}Zr_xO_2$, in which x is greater than 0.5 and is lower than 1.

In some embodiments of the present disclosure, a semiconductor device includes a substrate, a gate structure over the substrate, and source/drain regions in the substrate and on opposite sides of the gate structure. The gate structure includes an interfacial layer, a quasi-antiferroelectric (QAFE) layer over the interfacial layer, and a gate electrode over the QAFE layer. In a polarization-voltage curve of the QAFE layer, when a sweep voltage of 3V is applied, a remnant polarization (Pr) of the QAFE layer is in a range from about 0.5 µC/cm2 to about 5 µC/cm2, and a coercive voltage (Vc) of the QAFE layer is in a range from about 0.1 V to about 0.5 V.

In some embodiments of the present disclosure, a semiconductor device includes a substrate, a fin structure over the substrate, a gate structure over the fin structure, and source/drain regions in the substrate and on opposite sides of the gate structure. The gate structure includes an interfacial layer, a $Hf_{1-x}Zr_xO_2$ layer over the interfacial layer, and a gate electrode over the $Hf_{1-x}Zr_xO_2$ layer. A crystalline structure of the $Hf_{1-x}Zr_xO_2$ layer is a mixture of tetragonal phase and orthorhombic phase, and a ratio of the tetragonal phase to the tetragonal phase in the $Hf_{1-x}Zr_xO_2$ layer is in a range from about 1/10 to about 10/1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a semiconductor layer over the substrate;
a gate structure over the semiconductor layer, wherein the gate structure comprises:
an interfacial layer;
a quasi-antiferroelectric (QAFE) layer over the interfacial layer, the QAFE layer comprising $Hf_{1-x}Zr_xO_2$, wherein x is greater than 0.5 and is lower than 1, and wherein in a polarization-voltage curve of the QAFE layer, a remnant polarization (Pr) of the QAFE layer is in a range from about 0.5 $\mu C/cm^2$ to about 5 $\mu C/cm^2$; and
a gate electrode over the QAFE layer;
source/drain regions on opposite sides of the gate structure;
gate spacers on opposite sidewalls of the gate structure; and
inner spacers vertically between the semiconductor layer and the substrate, wherein the QAFE layer is in direct contact with the interfacial layer, the gate spacers, the inner spacers, and the gate electrode.

2. The semiconductor device of claim 1, wherein x is about 0.75.

3. The semiconductor device of claim 1, wherein a crystalline structure of the QAFE layer is a mixture of tetragonal phase and orthorhombic phase, and a ratio of the tetragonal phase to the tetragonal phase in the QAFE layer is in a range from about 1/10 to about 10/1.

4. The semiconductor device of claim 1, wherein the semiconductor device is operable in a subthreshold swing (SS) lower than about 60 (mV/dec) and without hysteresis.

5. The semiconductor device of claim 1, wherein the QAFE layer vertically overlaps the source/drain regions.

6. A semiconductor device, comprising:
a substrate;
a semiconductor layer over the substrate;
a gate structure over the semiconductor layer, wherein the gate structure comprises:
an interfacial layer;
a quasi-antiferroelectric (QAFE) layer over the interfacial layer, wherein in a polarization-voltage curve of the QAFE layer, when a sweep voltage of 3V is applied, a remnant polarization (Pr) of the QAFE layer is in a range from about 0.5 µC/cm2 to about 5 µC/cm2, and a coercive voltage (Vc) of the QAFE layer is in a range from about 0.1 V to about 0.5 V; and
a gate electrode over the QAFE layer;
source/drain regions in the substrate and on opposite sides of the gate structure;
gate spacers on opposite sidewalls of the gate structure; and
inner spacers vertically between the semiconductor layer and the substrate, wherein the QAFE layer is in direct contact with the interfacial layer, the gate spacers, the inner spacers and the gate electrode.

7. The semiconductor device of claim 6, wherein the QAFE layer comprising $HfZr_xO_2$, wherein x is greater than 0.5 and is lower than 1.

8. The semiconductor device of claim 7, wherein x is about 0.75.

9. The semiconductor device of claim 6, wherein the semiconductor device is operable in a subthreshold swing (SS) lower than about 60 (mV/dec) and without hysteresis.

10. The semiconductor device of claim 6, wherein the semiconductor device is operable without hysteresis.

11. The semiconductor device of claim 6, wherein a crystalline structure of the QAFE layer is a mixture of tetragonal phase and orthorhombic phase, and a ratio of the tetragonal phase to the tetragonal phase in the QAFE layer is in a range from about 1/10 to about 10/1.

12. The semiconductor device of claim 6, wherein the gate structure wraps around the semiconductor layer.

13. A semiconductor device, comprising:
a substrate;
a semiconductor layer over the substrate;
a gate structure wrapping around the semiconductor layer, wherein the gate structure comprises:
an interfacial layer;
a $Hf_{1-x}Zr_xO_2$ layer over the interfacial layer, wherein a crystalline structure of the $Hf_{1-x}Zr_xO_2$ layer is a mixture of tetragonal phase and orthorhombic phase, and a ratio of the tetragonal phase to the tetragonal phase in the $Hf_{1-x}Zr_xO_2$ layer is in a range from about 1/10 to about 10/1 such that the $Hf_{1-x}Zr_xO_2$ layer has quasi-antiferroelectric properties, and wherein in a polarization-voltage curve of the, a coercive voltage (Vc) of the $Hf_{1-x}Zr_xO_2$ layer is in a range from about 0.1 V to about 0.5 V; and
a gate electrode over the $Hf_{1-x}Zr_xO_2$ layer;
gate spacers on opposite sidewalls of the gate structure, wherein the Hf1-xZrxO2 layer has a portion in direct contact with the gate spacers, the portion has a U-shape cross-sectional profile, and a bottom surface of the portion is higher than bottom surfaces of the gate spacers; and
source/drain regions on opposite sides of the gate structure.

14. The semiconductor device of claim 13, wherein the semiconductor device is operable in a subthreshold swing (SS) lower than about 60 (mV/dec) and without hysteresis.

15. The semiconductor device of claim 13, wherein x is greater than 0.5 and is lower than 1.

16. The semiconductor device of claim 13, further comprising:
inner spacers vertically between the semiconductor layer and the substrate, wherein the $Hf_{1-x}Zr_xO_2$ layer is in direct contact with the interfacial layer, the inner spacers and the gate electrode.

17. The semiconductor device of claim 13, wherein a sidewall of the $Hf_{1-x}Zr_xO_2$ layer is vertically aligned with a sidewall of the interfacial layer.

18. The semiconductor device of claim 1, wherein the QAFE layer has a portion in direct contact with the gate spacers, the portion has a U-shape cross-sectional profile, and a bottom surface of the portion is higher than bottom surfaces of the gate spacers.

19. The semiconductor device of claim 6, wherein the QAFE layer has a portion in direct contact with the gate spacers, the portion has a U-shape cross-sectional profile, and a bottom surface of the portion is higher than bottom surfaces of the gate spacers.

20. The semiconductor device of claim 13, wherein in the polarization-voltage curve of the, a remnant polarization (Pr) of the Hf1-xZrxO2 layer is in a range from about 0.5 µC/cm2 to about 5 µC/cm2.

* * * * *